(12) United States Patent
Verma et al.

(10) Patent No.: US 11,669,446 B2
(45) Date of Patent: Jun. 6, 2023

(54) CONFIGURABLE IN MEMORY COMPUTING ENGINE, PLATFORM, BIT CELLS AND LAYOUTS THEREFORE

(71) Applicant: The Trustees of Princeton University, Princeton, NJ (US)

(72) Inventors: Naveen Verma, Princeton, NJ (US); Hossein Valavi, Princeton, NJ (US); Hongyang Jia, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 38 days.

(21) Appl. No.: 17/252,521

(22) PCT Filed: Jun. 18, 2019

(86) PCT No.: PCT/US2019/037686
§ 371 (c)(1),
(2) Date: Dec. 15, 2020

(87) PCT Pub. No.: WO2019/246064
PCT Pub. Date: Dec. 26, 2019

(65) Prior Publication Data
US 2021/0271597 A1    Sep. 2, 2021

Related U.S. Application Data

(60) Provisional application No. 62/686,296, filed on Jun. 18, 2018, provisional application No. 62/702,629, (Continued)

(51) Int. Cl.
*G06F 12/06* (2006.01)
*G06F 17/16* (2006.01)
(Continued)

(52) U.S. Cl.
CPC ...... *G06F 12/0607* (2013.01); *G06F 12/0207* (2013.01); *G06F 17/16* (2013.01);
(Continued)

(58) Field of Classification Search
CPC .. G06F 12/0607; G06F 12/0207; G06F 17/16; G06F 2212/454; G06F 15/7821;
(Continued)

(56) References Cited

U.S. PATENT DOCUMENTS 5,258,934 A * 11/1993 Agranat ............... G06E 1/045
708/7
5,630,160 A    5/1997 Simpson et al.
(Continued)

OTHER PUBLICATIONS

"Comparators". Analog Devices. Published 2009. <https://www.analog.com/media/en/training-seminars/tutorials/mt-083.pdf>. Retrieved Mar. 3, 2022. (Year: 2009).*
(Continued)

*Primary Examiner* — Charles Rones
*Assistant Examiner* — Hewy H Li
(74) *Attorney, Agent, or Firm* — Meagher Emanuel Laks Goldberg & Liao, LLP

(57) ABSTRACT

Various embodiments comprise systems, methods, architectures, mechanisms or apparatus for providing programmable or pre-programmed in-memory computing operations.

31 Claims, 13 Drawing Sheets

Related U.S. Application Data filed on Jul. 24, 2018, provisional application No. 62/754,805, filed on Nov. 2, 2018, provisional application No. 62/756,951, filed on Nov. 7, 2018.

(51) Int. Cl.

| | | |
|---|---|---|
| *G11C 11/4094* | (2006.01) | |
| *G11C 11/4097* | (2006.01) | |
| *G11C 11/419* | (2006.01) | |
| *H03K 19/20* | (2006.01) | |
| *G06N 3/065* | (2023.01) | |
| *G06F 12/02* | (2006.01) | |
| *G11C 11/4074* | (2006.01) | |

(52) U.S. Cl.
CPC .......... *G06N 3/065* (2023.01); *G11C 11/4074* (2013.01); *G11C 11/4094* (2013.01); *G11C 11/4097* (2013.01); *G11C 11/419* (2013.01); *H03K 19/20* (2013.01); *G06F 2212/454* (2013.01)

(58) Field of Classification Search
CPC .......... G06F 7/5443; G06F 2207/4814; G06F 15/17381; G06F 17/142; G06F 2207/4828; G06F 7/026; G06F 7/4806; G06F 7/483; G06F 9/3001; G06F 9/30; G06N 3/0635; G06N 3/063; G11C 11/4074; G11C 11/4094; G11C 11/4097; G11C 11/419; H03K 19/20
See application file for complete search history.

(56) References Cited

U.S. PATENT DOCUMENTS

| | | |
|---|---|---|
| 2002/0042256 A1 | 11/2002 | Baldwin et al. |
| 2005/0125477 A1* | 6/2005 | Genov .................. G06N 3/063 |
| | | 708/607 |
| 2009/0259713 A1 | 10/2009 | Blumrich et al. |
| 2016/0232951 A1* | 8/2016 | Shanbhag ............. G11C 11/419 |
| 2018/0373902 A1* | 12/2018 | Muralimanohar ..... G11C 13/00 |
| 2019/0043560 A1* | 2/2019 | Sumbul ................ G11C 7/1006 |
| 2019/0080230 A1* | 3/2019 | Hatcher ................ G06F 7/5443 |
| 2019/0392298 A1* | 12/2019 | Oshima ................ G06F 7/5443 |

OTHER PUBLICATIONS

International Search Report and Written Opinion for PCT/US2019/037686, dated Sep. 17, 2019.

Jain et al. "Computing in memory with spin-transfer torque magnetic ram", In: IEEE Transactions on Very Large Scale Integration (VLSI) Systems, Nov. 21, 2017 (Nov. 21, 2017).

Zhang et al., "A Machine-learning Classifier Implemented in a Standard 6T SRAM Array", IEEE VLSI Symp. on Circuits (VLSIC), pp. C252-C253, Jun. 2016.

Zhang et al., "In-Memory Computation of a Machine-Learning Classifier in a Standard 6T SRAM Array", IEEE J. of Solid-State Circuit (JSSC), vol. 52, No. 4, pp. 915-924, Apr. 2017.

Valavi et al., "A Mixed-Signal Binarized Convolutional-Neural-Network Accelerator Integrating Dense Weight Storage and Multiplication for Reduced Data Movement," to appear VLSI Symp on Circuits, Jun. 2018.

Jia et al., "A Programmable Heterogeneous Microprocessor Based on Bit-Scalable In-Memory Computing", IEEE J. Solid-State Circuits, vol. 55, No. 9, pp. 2609-2621, Sep. 2020.

* cited by examiner

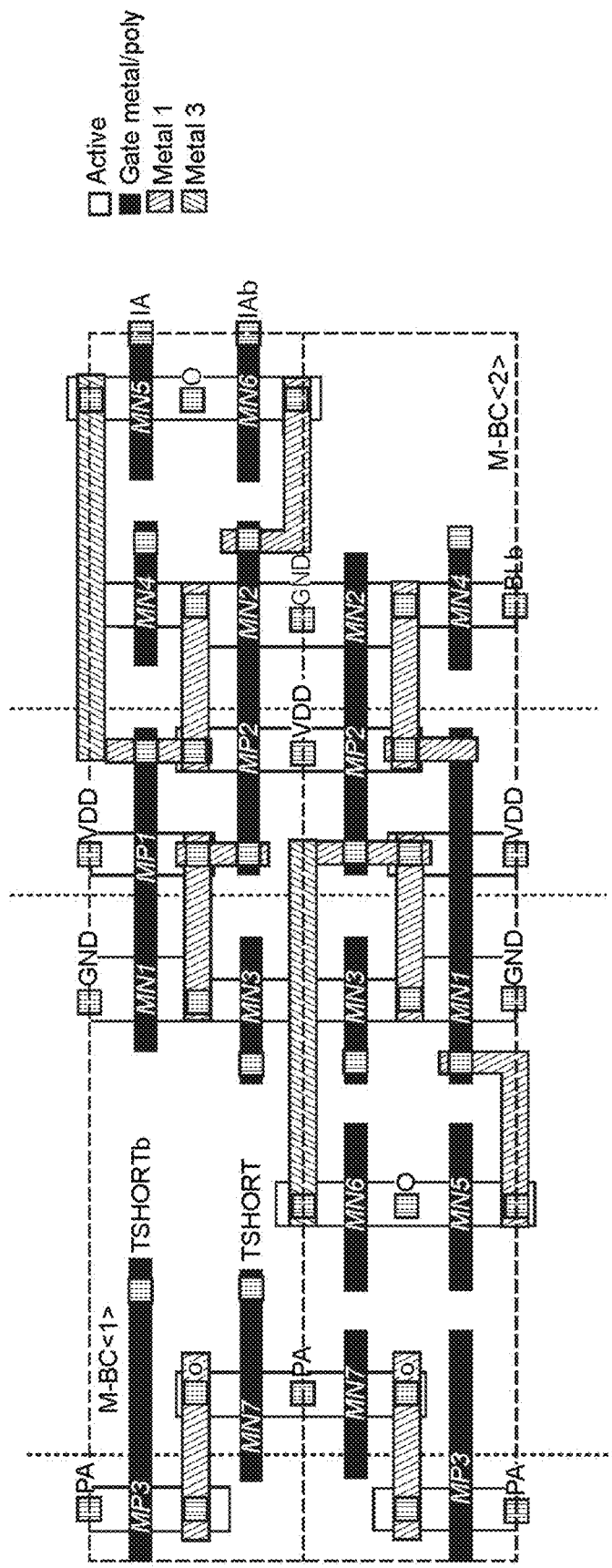
FIG. 13
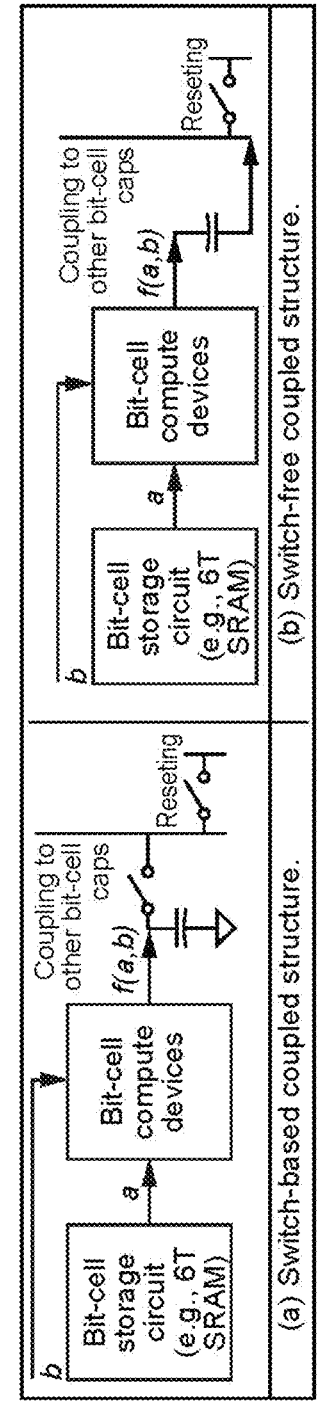
FIG. 14A (a) Switch-based coupled structure.
FIG. 14B (b) Switch-free coupled structure.

CONFIGURABLE IN MEMORY COMPUTING ENGINE, PLATFORM, BIT CELLS AND LAYOUTS THEREFORE

CROSS-REFERENCE TO RELATED APPLICATION

This application claims the benefit of U.S. Provisional Patent Application Ser. Nos. 62/686,296 filed Jun. 18, 2018, 62/702,629 filed Jul. 24, 2018, 62/754,805 filed Nov. 2, 2018, and 62/756,951 filed Nov. 7, 2018, which Applications are incorporated herein by reference in their entireties.

FIELD OF THE DISCLOSURE

The present invention relates to the field of in-memory computing and matrix-vector multiplication.

BACKGROUND

Charge-domain in-memory computing has recently emerged as a robust and scalable way of doing in-memory computing. Here, compute operations within memory bit-cells provide their results as charge, typically using voltage-to-charge conversion via a capacitor. Thus, bit-cell circuits involve appropriate switching of a local capacitor in a given bit-cell, where that local capacitor is also appropriately coupled to other bit-cell capacitors, to yield an aggregated compute result across the coupled bit-cells. In-memory computing is well suited to implementing matrix-vector multiplication, where matrix elements are stored in the memory array, and vector elements are broadcast in parallel fashion over the memory array.

SUMMARY

Various deficiencies in the prior art are addressed by systems, methods, architectures, mechanisms or apparatus providing programmable or pre-programmed in-memory computing operations.

One embodiment provides an in-memory computing architecture, comprising: a reshaping buffer, configured to reshape a sequence of received data words to form massively parallel bit-wise input signals; a compute-in-memory (CIM) array of bit-cells configured to receive the massively parallel bit-wise input signals via a first CIM array dimension and to receive one or more accumulation signals via a second CIM array dimension, wherein each of a plurality of bit-cells associated with a common accumulation signal forms a respective CIM channel configured to provide a respective output signal; analog-to-digital converter (ADC) circuitry configured to process the plurality of CIM channel output signals to provide thereby a sequence of multi-bit output words; control circuitry configured to cause the CIM array to perform a multi-bit computing operation on the input and accumulation signals using single-bit internal circuits and signals; and a near-memory computing path configured to provide the sequence of multi-bit output words as a computing result.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIG. 13 depicts an exemplary IC of the M-BC of FIG. 12;

FIG. 14A-B depict block diagrams of a bit-cell with a switch-based coupled structure and a switch-free coupled structure, respectively;

Figure 1:
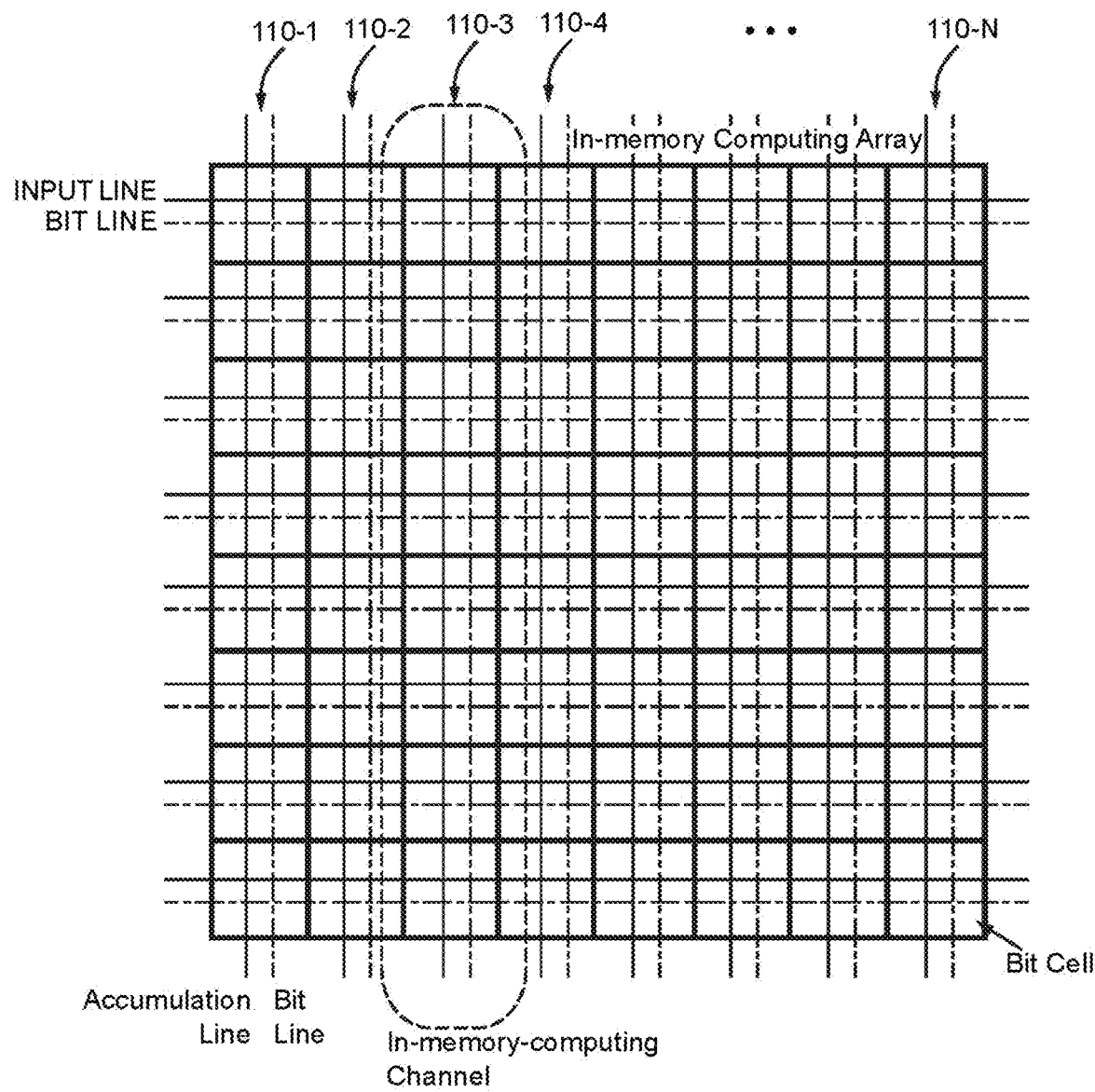
FIG. 1 depicts a typical structure of an in-memory computing architecture.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein. It must be noted that as used herein and in the appended claims, the singular forms "a", "an", and "the" include plural referents unless the context clearly dictates otherwise.

Disclosed embodiments include a system and method that enables programmability of a highly efficient linear algebra computing architecture for modern VLSI implementations. The computing architecture disclosed herein is referred to as "in-memory computing", and programmability of this architecture will enable it broad use across a range of applications especially for machine learning and artificial intelligence. The disclosed approach introduces a range of configurability features around in-memory computing arrays, which also enables their integration in programmable platforms, for addressing the energy and throughput now for a broad range of machine-learning and artificial-intelligence applications.

Linear algebra operations, most notably matrix-vector multiplications, have become highly prominent in emerging workloads, especially from machine learning (ML) and artificial intelligence (AI). Often the dimensionalities of the matrices and vectors can be quite large (commonly >100). Due to the ways that elements are reused in such operations, the elements are typically stored in embedded or off-chip memory (depending on the number of elements that must be stored). Implementations in modern VLSI technologies have shown that in fact the energy and delay of accessing data from such memories substantially dominates over that of actual compute on the data. This has limited the energy/delay reductions that can be achieved by conventional accelerators, which separate memory and compute, and has motivated the paradigm of in-memory computing. Within the context of an in-memory computing system, raw data is not accessed from memory, but rather a computational result over many bits of raw data is accessed, thereby amortizing the accessing energy and delay.

The disclosed systems, methods and portions thereof enable configurability and programmability of a highly efficient linear algebra computing architecture for modern VLSI implementations and the like, leading to an integrated circuit implementation. The computing architecture disclosed herein may be broadly referred to as "in-memory computing," and the programmability of this architecture enables broad use across a range of applications including such as matrix vector computations and the like as used in machine learning, artificial intelligence and other applications. In various embodiments, the disclosed systems, methods and portions thereof enable configurability and programmability of an in-memory computing architecture using a hybrid analog/digital computing scheme employing parallel and serial operations.

While the disclosed approach can lead to a particular form of quantization noise in the way it performs computation, this is controlled through a number of the architectural features disclosed herein, in one case enabling operations exhibiting quantization noise as in standard integer fixed-point precision computing.

The disclosed systems and portions thereof have been implemented as an integrated circuit, and the various features thereof have been implemented as field programmable gate arrays (FPGAs) as well as simulated using Verilog/transistor-level simulations.

The disclosed approach may be applied to a range of in-memory computing architectures including the architecture disclosed in provisional patent application Ser. No. 62/555,959, "Analog Switched-Capacitor Neural Network", filed Sep. 8, 2017, and incorporated by reference in its entirety as if fully set forth herein.

The disclosed approach enables configurability and programmability of in-memory computing which is proving to be a highly energy-efficient approach to linear-algebra computations. Such configuration and programmability enables the use of the disclosed architecture in a broad range of applications.

Further disclosed embodiments provide a Bit-parallel/Bit-Serial Approach to Multi-bit In-memory Computing. Specifically, also disclosed herein are in memory-computing architectures, where memory bit-cells perform computations on 1-b operands, and the hardware is extended to enable operations on multi-bit operands using a bit-parallel/bit-serial (BP/BS) scheme, where multiple bits of one operand are mapped to parallel bit-cells, and multiple bits of the other operand are inputted serially. The disclosed approach allows for in-memory computing, where the computation output bit-cells is digitized and then fed to further computation, possible across different bit-cell output computations in time and space; in-memory computing where multi-bit operand computation is performed in a bit-parallel/bit-serial (BP/BS) manner on digitized outputs; in-memory computing where the BP/BS approach uses 2's complement number representation, for instance, by employing bit-wise AND computation by bit-cells; and in-memory computing where the BP/BS approach uses a different number representation, for instance, where 1/0 bits are taken to have values of +1/−1 mathematically, to enable use of XNOR computation by bit-cells.

Configurable In-Memory Computing Engine and Platform

Various embodiments are directed to integrating configurability and hardware support around in-memory computing accelerators to enable programmability and virtualization required for broadening to practical applications. Generally, in-memory computing implements matrix-vector multiplication, where matrix elements are stored in the memory array, and vector elements are broadcast in parallel fashion over the memory array. Several aspects of the embodiments are directed toward enabling programmability and configurability of such an architecture:

In-memory computing typically involves 1-b representation for either the matrix elements, vector elements, or both. This is because the memory stores data in independent bit-cells, to which broadcast is done in a parallel homogeneous fashion, without provision for the different binary weighted coupling between bits required for multi-bit compute. In this invention, extension to multi-bit matrix and vector elements is achieved via a bit-parallel/bit-serial (BPBS) scheme.

To enable common compute operations that often surround matrix-vector multiplication, a highly-configurable/programmable near-memory-computing data path is included. This both enables computations required to extend from bit-wise computations of in-memory computing to multi-bit computations, and, for generality, this supports multi-bit operations, no longer constrained to the 1-b representations inherent for in-memory computing. Since programmable/configurable and multi-bit computing is more efficient in the digital domain, in this invention analog-to-digital conversion is performed following in-memory computing, and, in the particular embodiment, the configurable datapath is multiplexed among eight ADC/in-memory-computing channels, though other multiplexing ratios can be employed. This also aligns well with the BPBS scheme employed for multi-bit matrix-element support, where support up to 8-b operands is provided in the embodiment.

Since input-vector sparsity is common in many linear-algebra applications, this invention integrates support to enable energy-proportional sparsity control. This is achieved by masking the broadcasting of bits from the input vector, which correspond to zero-valued elements (such masking is done for all bits in the bit-serial process). This saves broadcast energy as well as compute energy within the memory array.

Given the internal bit-wise compute architecture for in-memory computing and the external digital-word architecture of typical microprocessors, data-reshaping hardware is used both for the compute interface, through which input vectors are provided, and for the memory interface through which matrix elements are written and read.

FIG. 1 depicts a typical structure of an in-memory computing architecture. Consisting of a memory array (which could be based on standard bit-cells or modified bit-cells), in-memory computing involves two additional, "perpendicular" sets of signals; namely, (1) input lines; and (2) accumulation lines. Referring to FIG. 1, it can be seen that a two-dimensional array of bit cells is depicted, where each of a plurality of in-memory-computing channels 110 comprises a respective column of bit-cells where each of the bit cells a channel is associated with a common accumulation line and bit line (column), and a respective input line and word line (row). It is noted that the columns and rows of signals are denoted herein as being "perpendicular" with respect to each other to simply indicate a row/column relationship within the context of an array of bit cells such as the two-dimensional array of bit-cells depicted in FIG. 1. The term "perpendicular" as used herein is not intended to convey any specific geometric relationship.

The input/bit and accumulation/bit sets of signals may be physically combined with existing signals within the memory (e.g., word lines, bit lines) or could be separate. For implementing matrix-vector multiplication, the matrix elements are first loaded in the memory cells. Then, multiple input-vector elements (possibly all) are applied at once via the input lines. This causes a local compute operation, typically some form of multiplication, to occur at each of the memory bit-cells. The results of the compute operations are then driven onto the shared accumulation lines. In this way, the accumulation lines represent a computational result over the multiple bit-cells activated by input-vector elements. This is in contrast to standard memory accessing, where bit-cells are accessed via bit lines one at a time, activated by a single word line.

In-memory computing as described, has a number of important attributes. First, compute is typically analog. This because the constrained structure of memory and bit-cells requires richer compute models than enabled by simple digital switch-based abstractions. Second, the local operation at the bit-cells typically involves compute with a 1-b representation stored in the bit-cell. This is because the bit-cells in a standard memory array do not couple with each other in any binary-weighted fashion; any such coupling must be achieved by methods of bit-cell accessing/readout from the periphery. Below, the extensions on in-memory computing proposed in the invention are described.

Extension to Near-Memory and Multi-Bit Compute.

While in-memory computing has the potential to address matrix-vector multiplication in a manner that conventional digital acceleration falls short, typical compute pipelines will involve a range of other operations surrounding matrix-vector multiplication. Typically, such operations are well addressed by conventional digital acceleration; nonetheless, it may be of high value to place such acceleration hardware near the in-memory-compute hardware, in an appropriate architecture to address the parallel nature, high throughput (and thus need for high communication bandwidth to/from), and general compute patterns associated with in-memory computing. Since much of the surrounding operations will preferably be done in the digital domain, analog-to-digital conversion via ADCs is included following each of the in-memory computing accumulation lines, which we thus refer to as an in-memory-computing channels. A primary challenge is integrating the ADC hardware in the pitch of each in-memory-computing channel, but proper layout approaches taken in this invention enable this.

Introducing an ADC following each compute channel enables efficient ways of extending in-memory compute to support multi-bit matrix and vector elements, via bit-parallel/bit-serial (BPBS) compute, respectively. Bit-parallel compute involves loading the different matrix-element bits in different in-memory-computing columns. The ADC outputs from the different columns are then appropriately bit shifted to represent the corresponding bit weighting, and digital accumulation over all of the columns is performed to yield the multi-bit matrix-element compute result. Bit-serial compute, on the other hand, involves apply each bit of the vector elements one at a time, storing the ADC outputs each time and bit shifting the stored outputs appropriately, before digital accumulation with the next outputs corresponding to subsequent input-vector bits. Such a BPBS approach, enabling a hybrid of analog and digital compute, is highly efficient since it exploits the high-efficiency low-precision regime of analog (1-b) with the high-efficiency high-precision regime of digital (multi-bit), while overcoming the accessing costs associated with conventional memory operations.

While a range of near-memory computing hardware can be considered, details of the hardware integrated in the current embodiment of the invention are described below. To ease the physical layout of such multi-bit digital hardware, eight in-memory-computing channels are multiplexed to each near-memory computing channel. We note that this enables the highly-parallel operation of in-memory computing to be throughput matched with the high-frequency operation of digital near-memory computing (highly-parallel analog in-memory computing operates at lower clock frequency than digital near-memory computing). Each nearmemory-computing channel then includes digital barrel shifters, multipliers, accumulators, as well as look-up-table (LUT) and fixed non-linear function implementations. Additionally, configurable finite-state machines (FSMs) associated with the near-memory computing hardware are integrated to control computation through the hardware.

Input Interfacing and Bit-Scalability Control

For integrating in-memory computing with a programmable microprocessor, the internal bit-wise operations and representations must be appropriately interfaced with the external multi-bit representations employed in typical microprocessor architectures. Thus, data reshaping buffers are included at both the input-vector interface and the memory read/write interface, through which matrix elements are stored in the memory array. Details of the design employed for the invention embodiment are described below. The data reshaping buffers enable bit-width scalability of the input-vector elements, while maintaining maximal bandwidth of data transfer to the in-memory computing hardware, between it and external memories as well as other architectural blocks. The data reshaping buffers consist of register files that serving as line buffers receiving incoming parallel multi-bit data element-by-element for an input vector, and providing outgoing parallel single-bit data for all vector elements.

In addition to word-wise/bit-wise interfacing, hardware support is also included for convolutional operations applied to input vectors. Such operations are prominent in convolutional-neural networks (CNNs). In this case, matrix-vector multiplication is performed with only a subset of new vector elements needing to be provided (other input-vector elements are stored in the buffers and simply shifted appropriately). This mitigates bandwidth constraints for getting data to the high-throughput in-memory-computing hardware. In the invention embodiment, the convolutional support hardware, which must perform proper bit-serial sequencing of the multi-bit input-vector elements, is implemented within specialized buffers whose output readout properly shifts data for configurable convolutional striding.

Dimensionality and Sparsity Control

For programmability, two additional considerations must be addressed by the hardware: (1) matrix/vector dimensions can be variable across applications; and (2) in many applications the vectors will be sparse.

Regarding dimensionality, in-memory computing hardware often integrates control to enable/disable tiled portions of an array, to consume energy only for the dimensionality levels desired in an application. But, in the BPBS approach employed, input-vector dimensionality has important implications on the computation energy and SNR. Regarding SNR, with bit-wise compute in each in-memory-computing channel, presuming the computation between each input (provided on an input line) and the data stored in a bit-cell yields a one-bit output, the number of distinct levels possible on an accumulation line is equal to N+1, where N is the input-vector dimensionality. This suggests the need for a log 2(N+1) bit ADC. However, an ADC has energy cost that scales strongly with the number of bits. Thus, it may be beneficial to support very large N, but fewer than log 2(N+1) bits in the ADC, to reduce the relative contribution of the ADC energy. The result of doing this is that the signal-to-quantization-noise ratio (SQNR) of the compute operation is different than standard fixed-precision compute, and is reduced with the number of ADC bits. Thus, to support varying application-level dimensionality and SQNR requirements, with corresponding energy consumption, hardware support for configurable input-vector dimensionality is essential. For instance, if reduced SQNR can be tolerated, large-dimensional input-vector segments should be support; on the other hand, if high SQNR must be maintained, lower-dimensional input-vector segments should be supported, with inner-product results from multiple input-vector segments combinable from different in-memory-computing banks (in particular, input-vector dimensionality could thus be reduced to a level set by the number of ADC bits, to ensure compute ideally matched with standard fixed-precision operation). The hybrid analog/digital approach taken in the invention enables this. Namely, input-vector elements can be masked to filter broadcast to only the desired dimensionality. This saves broadcast energy and bit-cell compute energy, proportionally with the input-vector dimensionality.

Regarding sparsity, the same masking approach can be applied throughout the bit-serial operations to prevent broadcasting of all input-vector element bits that correspond to zero-valued elements. We note that the BPBS approach employed is particularly conducive to this. This is because, while the expected number of non-zero elements is often known in sparse-linear-algebra applications, the input-vector dimensionalities can be large. The BPBS approach thus allows us to increase the input-vector dimensionality, while still ensuring the number of levels required to be supported on the accumulation lines is within the ADC resolution, thereby ensuring high computational SQNR. While the expected number of non-zero elements is known, it is still essential to support variable number of actual non-zero elements, which can be different from input vector to input vector. This is readily achieved in the hybrid analog/digital approach, since the masking hardware has simply to count the number of zero-value elements for the given vector, and then apply a corresponding offset to the final inner-product result, in the digital domain after BPBS operation.

Exemplary Integrated Circuit Architecture

Figure 2:
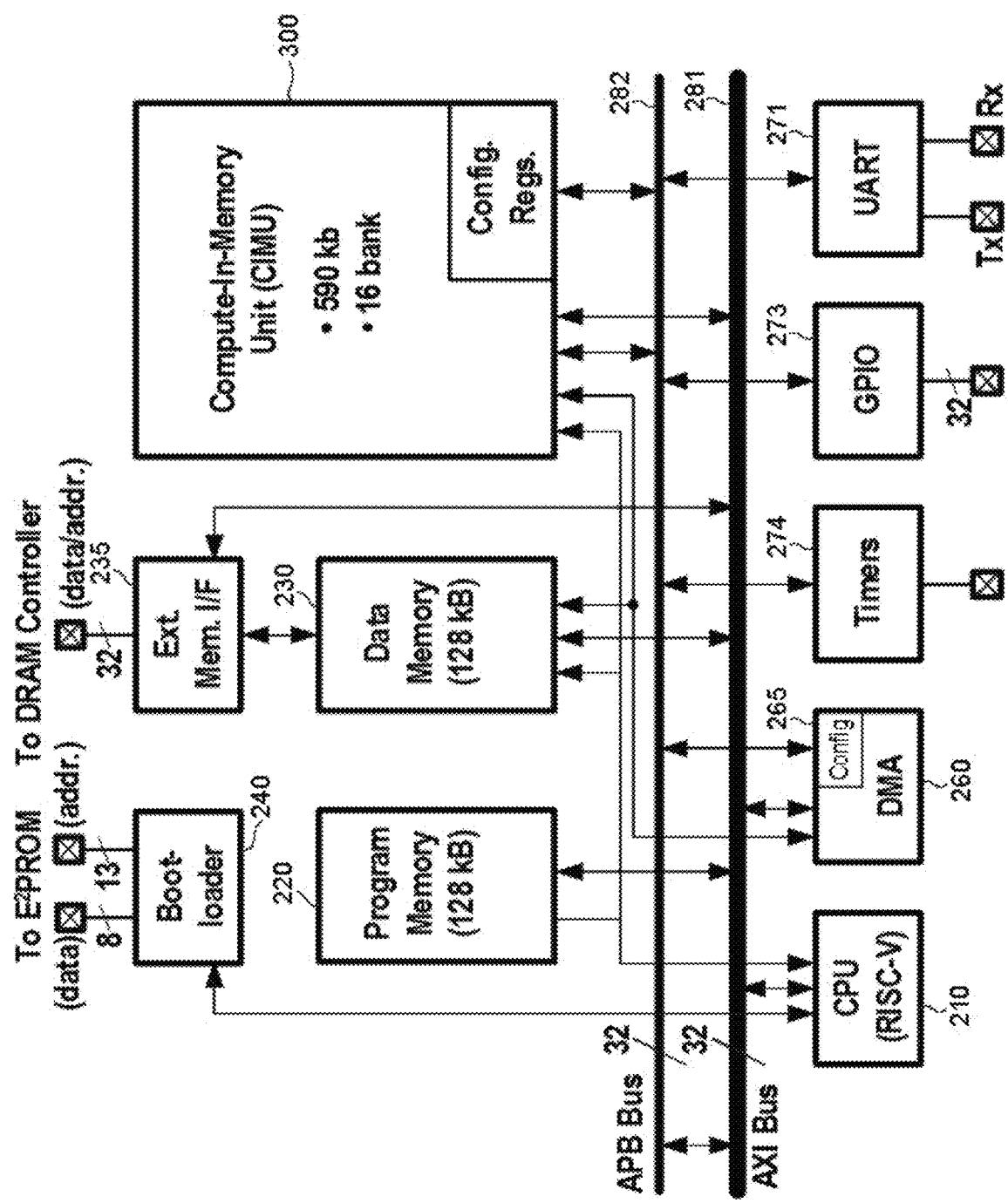
FIG. 2 depicts a high level block diagram of an exemplary architecture according to an embodiment.

FIG. 2 depicts a high level block diagram of an exemplary architecture according to an embodiment. Specifically, the exemplary architecture of FIG. 2 was implemented as an integrated circuit using VLSI fabrication techniques using specific components and functional elements so as to test the various embodiments herein. It will be appreciated that further embodiments with different components (e.g., larger or more powerful CPUs, memory elements, processing elements and so on) are contemplated by the inventors to be within the scope of this disclosure.

As depicted in FIG. 2, the architecture 200 comprises a central processing unit (CPU) 210 (e.g., a 32-bit RISC-V CPU), a program memory (PMEM) 220 (e.g., a 128 KB program memory), a data memory (DMEM) 230 (e.g., a 128 KB data memory), an external memory interface 235 (e.g., configured to access, illustratively, one or more 32-bit external memory devices (not shown) to thereby extend accessible memory), a bootloader module 240 (e.g., configured to access an 8 KB off-chip EEPROM (not shown)), a computation-in-memory unit (CIMU) 300 including various configuration registers 255 and configured to perform in-memory computing and various other functions in accordance with the embodiments described herein, a direct-memory-access (DMA) module 260 including various configuration registers 265, and various support/peripheral modules, such as a Universal Asynchronous Receiver/Transmitter (UART) module 271 for receiving/transmitting data, a general purpose input/output (GPIO) module 273, various timers 274 and the like. Other elements not depicted herein may also be included in the architecture 200 of FIG. 2, such as SoC config modules (not shown) and so on.

The CIMU 300 is very well suited to matrix-vector multiplication and the like; however, other types of computations/calculations may be more suitably performed by non-CIMU computational apparatus. Therefore, in various embodiments a close proximity coupling between the CIMU 300 and near memory is provided such that the selection of computational apparatus tasked with specific computations and/or functions may be controlled to provide a more efficient compute function.

Figure 3:
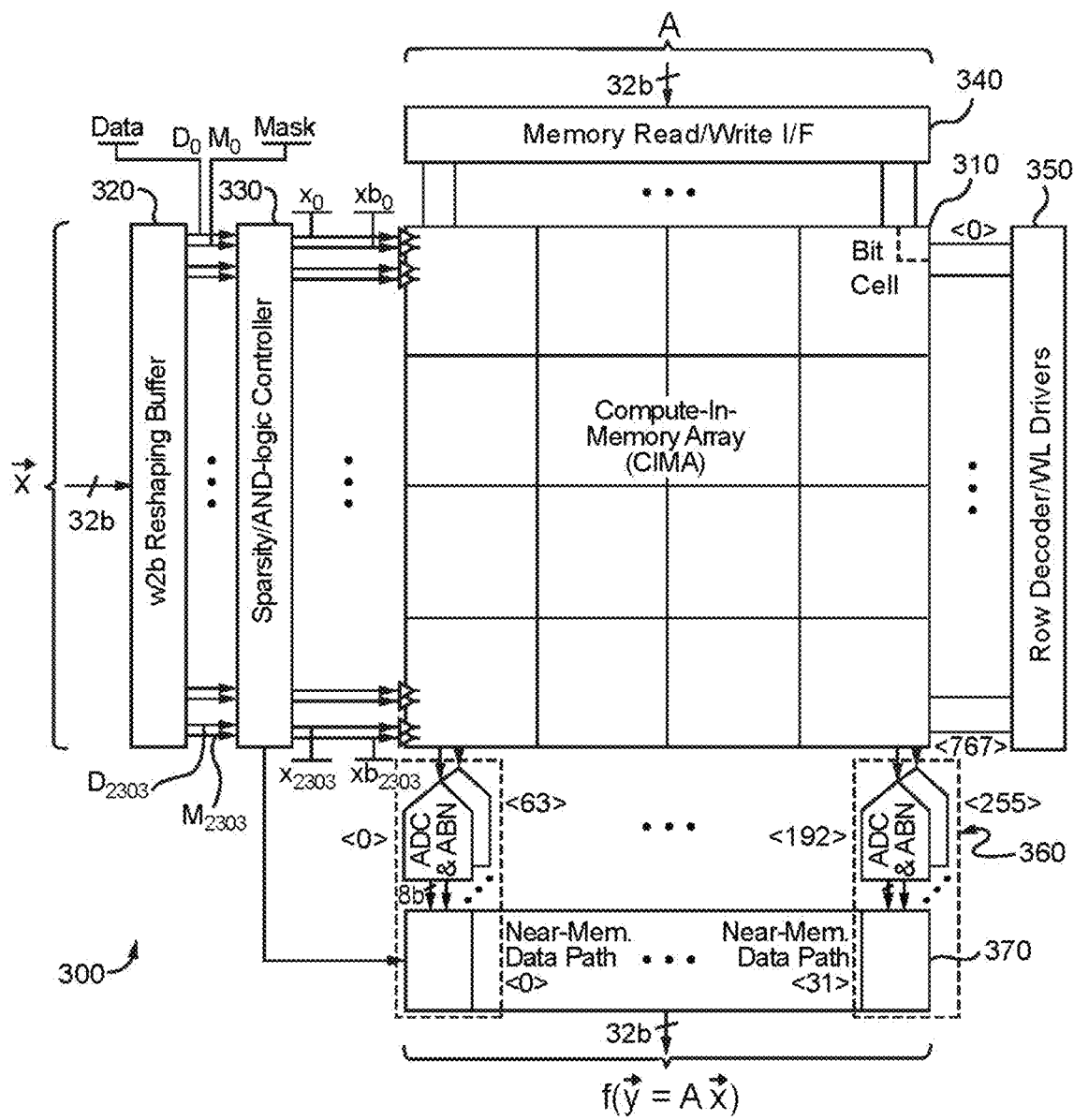
FIG. 3 depicts a high level block diagram of an exemplary Compute-In-Memory-Unit (CIMU) suitable for use in the architecture of FIG. 2.

FIG. 3 depicts a high level block diagram of an exemplary Compute-In-Memory-Unit (CIMU) 300 suitable for use in the architecture of FIG. 2. The following discussion relates to the architecture 200 of FIG. 2 as well as the exemplary CIMU 300 suitable for use within the context of that architecture 200.

Generally speaking, the CIMU 300 comprises various structural elements including a computation-in-memory array (CIMA) of bit-cells configured via, illustratively, various configuration registers to provide thereby programmable in-memory computational functions such as matrix-vector multiplications and the like. In particular, the exemplary CIMU 300 is configured as a 590 kb, 16 bank CIMU tasked with multiplying an input matrix X by an input vector A to produce an output matrix Y.

Referring to FIG. 3, the CIMU 300 is depicted as including a computation-in-memory array (CIMA) 310, an Input-Activation Vector Reshaping Buffer (IA BUFF) 320, a sparsity/AND-logic controller 330, a memory read/write interface 340, row decoder/WL drivers 350, a plurality of A/D converters 360 and a near-memory-computing multiply-shift-accumulate data path (NMD) 370.

The illustrative computation-in-memory array (CIMA) 310 comprises a 256×(3×3×256) computation-in-memory array arranged as 4×4 clock-gateable 64×(3×3×64) in-memory-computing arrays, thus having a total of 256 in-memory computing channels (e.g., memory columns), where there are also included 256 ADCs 360 to support the in-memory-computing channels.

The IA BUFF 320 operates to receive a sequence of, illustratively, 32-bit data words and reshapes these 32-bit data words into a sequence of high dimensionality vectors suitable for processing by the CIMA 310. It is noted that data words of 32-bits, 64-bits or any other width may be reshaped to conform to the available or selected size of the compute in memory array 310, which itself is configured to operate on high dimensionality vectors and comprises elements which may be 2-8 bits, 1-8 bits or some other size and applies them in parallel across the array. It is also noted that the matrix-vector multiplication operation described herein is depicted as utilizing the entirety of the CIMA 310; however, in various embodiments only a portion of the CIMA 310 is used. Further, in various other embodiments the CIMA 310 and associated logic circuitry is adapted to provide and interleaved matrix-vector multiplication operation wherein parallel portions of the matrix are simultaneously processed by respective portions of the CIMA 310.

In particular, the IA BUFF 320 reshapes the sequence of 32-bit data words into highly parallel data structures which may be added to the CIMA 310 at once (or at least in larger chunks) and properly sequenced in a bit-serial manner. For example, a four bit compute having eight vector elements may be associated with a high dimensionality vector of over 2000 n-bit data elements. The IA BUFF 320 forms this data structure.

As depicted herein the IA BUFF 320 is configured to receive the input matrix X as a sequence of, illustratively, 32-bit data words and resize/reposition the sequence of received data words in accordance with the size of the CIMA 310, illustratively to provide a data structure comprising 2303 n-bit data elements. Each of these 2303 n-bit data elements, along with a respective masking bit, is communicated from the IA BUFF 320 to the sparsity/AND-logic controller 330.

The sparsity/AND-logic controller 330 is configured to receive the, illustratively, 2303 n-bit data elements and respective masking bits and responsively invoke a sparsity function wherein zero value data elements (such as indicated by respective masking bits) are not propagated to the CIMA 310 for processing. In this manner, the energy otherwise necessary for the processing of such bits by the CIMA 310 is conserved.

In operation, the CPU 210 reads the PMEM 220 and bootloader 240 through a direct data path implemented in a standard manner. The CPU 210 may access DMEM 230, IA BUFF 320 and memory read/write buffer 340 through a direct data path implemented in a standard manner. All these memory modules/buffers, CPU 210 and DMA module 260 are connected by AXI bus 281. Chip configuration modules and other peripheral modules are grouped by APB bus 282, which is attached to the AXI bus 281 as a slave. The CPU 210 is configured to write to the PMEM 220 through AXI bus 281. The DMA module 260 is configured to access DMEM 230, IA BUFF 320, memory read/write buffer 340 and NMD 370 through dedicated data paths, and to access all the other accessible memory space through the AXI/APB bus such as per DMA controller 265. The CIMU 300 performs the BPBS matrix-vector multiplication described above. Further details of these and other embodiments are provided below.

Thus, in various embodiments, the CIMA operates in a bit serial bit parallel (BSBP) manner to receive vector information, perform matrix-vector multiplication, and provide a digitized output signal (i.e., Y=AX) which may be further processed by another compute function as appropriate to provide a compound matrix-vector multiplication function.

Generally speaking, the embodiments described herein provide an in-memory computing architecture, comprising: a reshaping buffer, configured to reshape a sequence of received data words to form massively parallel bit-wise input signals; a compute-in-memory (CIM) array of bit-cells configured to receive the massively parallel bit-wise input signals via a first CIM array dimension and to receive one or more accumulation signals via a second CIM array dimension, wherein each of a plurality of bit-cells associated with a common accumulation signal forms a respective CIM channel configured to provide a respective output signal; analog-to-digital converter (ADC) circuitry configured to process the plurality of CIM channel output signals to provide thereby a sequence of multi-bit output words; control circuitry configured to cause the CIM array to perform a multi-bit computing operation on the input and accumulation signals using single-bit internal circuits and signals; and a near-memory computing path configured to provide the sequence of multi-bit output words as a computing result.

Memory Map and Programming Model

Since the CPU 210 is configured to access the IA BUFF 320 and memory read/write buffer 340 directly, these two memory spaces look similar to the DMEM 230 from the perspective of a user program and in term of latency and energy, especially for structured data such as array/matrix data and the like. In various embodiments, when the in-memory computing feature is not activated or partially activated, the memory read/write buffer 340 and CIMA 310 may be used as normal data memory.

Figure 4:
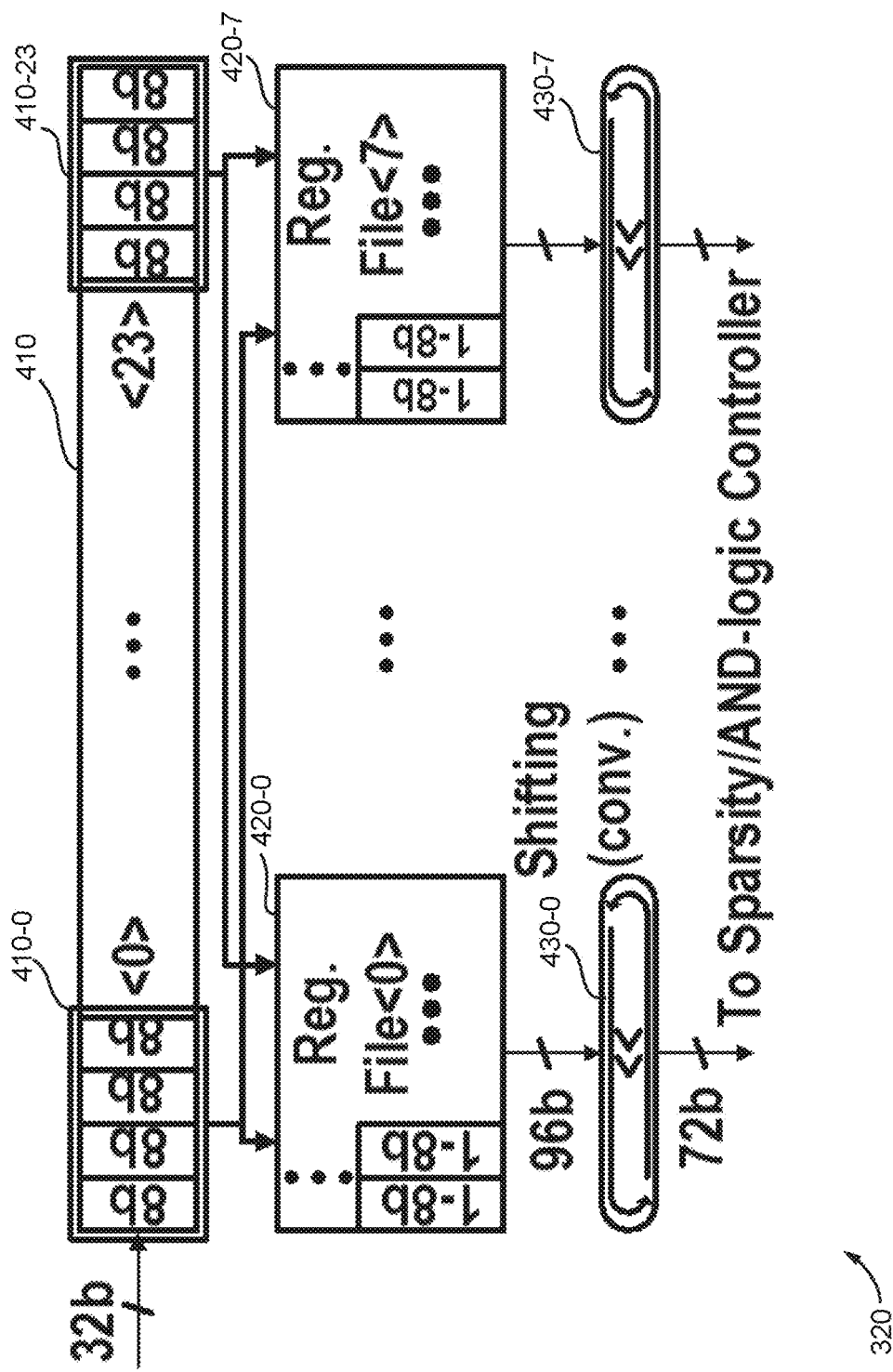
FIG. 4 depicts a high level block diagram of an Input-Activation Vector Reshaping Buffer (IA BUFF) according to an embodiment and suitable for use in the architecture of FIG. 2.

FIG. 4 depicts a high level block diagram of an Input-Activation Vector Reshaping Buffer (IA BUFF) 320 according to an embodiment and suitable for use in the architecture of FIG. 2. The depicted IA BUFF 320 supports input-activation vectors with element precision from 1 bit to 8 bits; other precisions may also be accommodated in various embodiments. According to a bit-serial flow mechanism discussed herein, a particular bit of all elements in an input-activation vector are broadcast at once to the CIMA 310 for a matrix-vector multiplication operation. However, the highly-parallel nature of this operation requires that elements of the high-dimensionality input-activation vector be provided with maximum bandwidth and minimum energy, otherwise the throughput and energy efficiency benefits of in-memory computing would not be harnessed. To achieve this, the input-activation reshaping buffer (IA BUFF) 320 may be constructed as follows, so that in-memory computing can be integrated in a 32-bit (or other bit-width) architecture of a microprocessor, whereby hardware for the corresponding 32-bit data transfers is maximally utilized for the highly-parallel internal organization of in-memory computing.

Referring to FIG. 4, the IA BUFF 320 receives 32-bit input signals, which may contain input-vector elements of bit precision from 1 to 8 bits. Thus the 32-bit input signals are first stored in 4×8-b registers 410, of which there are a total of 24 (denoted herein as registers 410-0 through 410-23). These registers 410 provide their contents to 8 register files (denoted as register files 420-0 through 420-8), each of which has 96 columns, and where the input vector, with dimensionality up to 3×3×256=2304, is arranged with its elements in parallel columns. This is done in the case of 8-b input elements, by the 24 4×8-b registers 410 providing 96 parallel outputs spanning one of the register files 420, and in the case of 1-b input elements, by the 24 4×8-b registers 410 providing 1536 parallel outputs, spanning all eight register files 420 (or with intermediate configurations for other bit precisions). The height of each register-file column is 2×4×8-b, allowing each input vector (with element precision up to 8 bits) to be stored in 4 segments, and enabling double buffering, for cases where all input-vector elements are to be loaded. On the other hand, for cases where as few as one-third of the input-vector elements are to be loaded (i.e., CNN with stride of 1), one out of every four register-file columns serves as a buffer, allowing data from the other three columns to be propagated forward to the CIMU for computation.

Thus, of the 96 columns output by each register file 420, only 72 are selected by a respective circular barrel-shifting interface 430, giving a total of 576 outputs across the 8 register files 420 at once. These outputs correspond to one of the four input-vector segments stored in the register files. Thus, four cycles are required to load all the input-vector elements into the sparsity/AND-logic controller 330, within 1-b registers.

To exploit sparsity in input-activation vector, a mask bit is generated for each data element while the CPU 210 or DMA 260 writes into the reshaping buffer 320. The masked input-activation prevents charge-based computation operations in the CIMA 310, which saves computation energy. The mask vector is also stored in SRAM blocks, organized similarly as the input-activation vector, but with one-bit representation.

The 4-to-3 barrel-shifter 430 is used to support VGG style (3×3 filter) CNN computation. Only one of three of the input-activation vectors needs to be updated when moving to the next filtering operation (convolutional reuse), which saves energy and enhances throughput.

Figure 5:
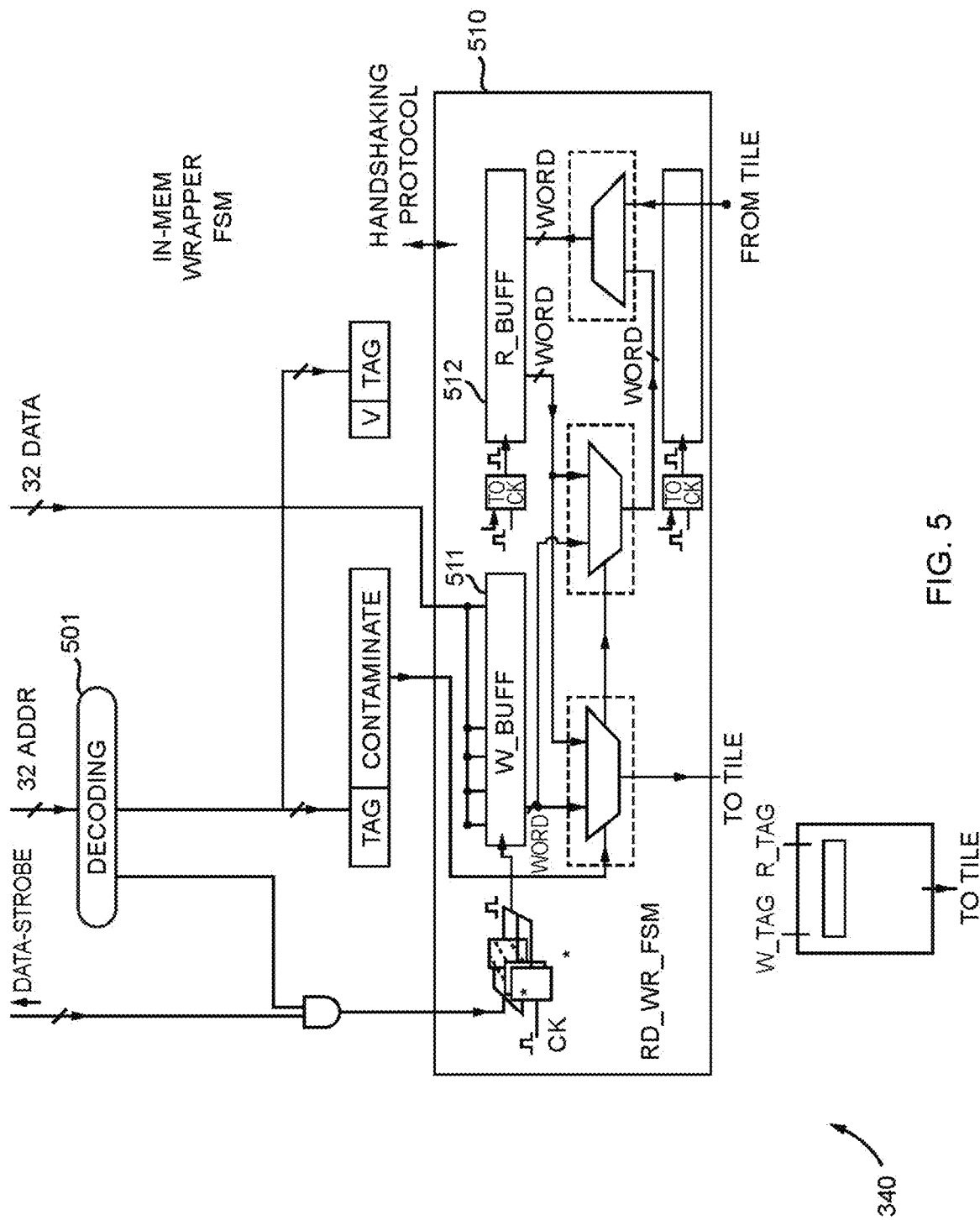
FIG. 5 depicts a high level block diagram of a CIMA Read/Write Buffer according to an embodiment and suitable for use in the architecture of FIG. 2.

FIG. 5 depicts a high level block diagram of a CIMA Read/Write Buffer 340 according to an embodiment and suitable for use in the architecture of FIG. 2. The depicted CIMA Read/Write Buffer 340 is organized as, illustratively, a 768-bit wide static random access memory (SRAM) block 510, while the word width of the depicted CPU is 32-bit in this example; a read/write buffer 340 is used to interface therebetween.

The read/write buffer 340 as depicted contains a 768-bit write register 511 and 768-bit read register 512. The read/write buffer 340 generally acts like a cache to the wide SRAM block in CIMA 310; however, some details are different. For example, the read/write buffer 340 writes back to CIMA 310 only when the CPU 210 writes to a different row, while reading a different row does not trigger write-back. When the reading address matches with the tag of write register, the modified bytes (indicated by contaminate bits) in the write register 511 are bypassed to the read register 512, instead of reading from CIMA 310.

Accumulation-line Analog-to-digital Converters (ADCs). The accumulations lines from the CIMA 310 each have an 8-bit SAR ADC, fitting into the pitch of the in-memory-computing channel. To save area, a finite-state machine (FSM) controlling bit-cycling of the SAR ADCs is shared among the 64 ADCs required in each in-memory-computing tile. The FSM control logic consists of 8+2 shift registers, generating pulses to cycle through the reset, sampling, and then 8 bit-decision phases. The shift-register pulses are broadcast to the 64 ADCs, where they are locally buffered, used to trigger the local comparator decision, store the corresponding bit decision in the local ADC-code register, and then trigger the next capacitor-DAC configuration. High-precision metal-oxide-metal (MOM) caps may be used enable small size of each ADC's capacitor array.

Figure 6:
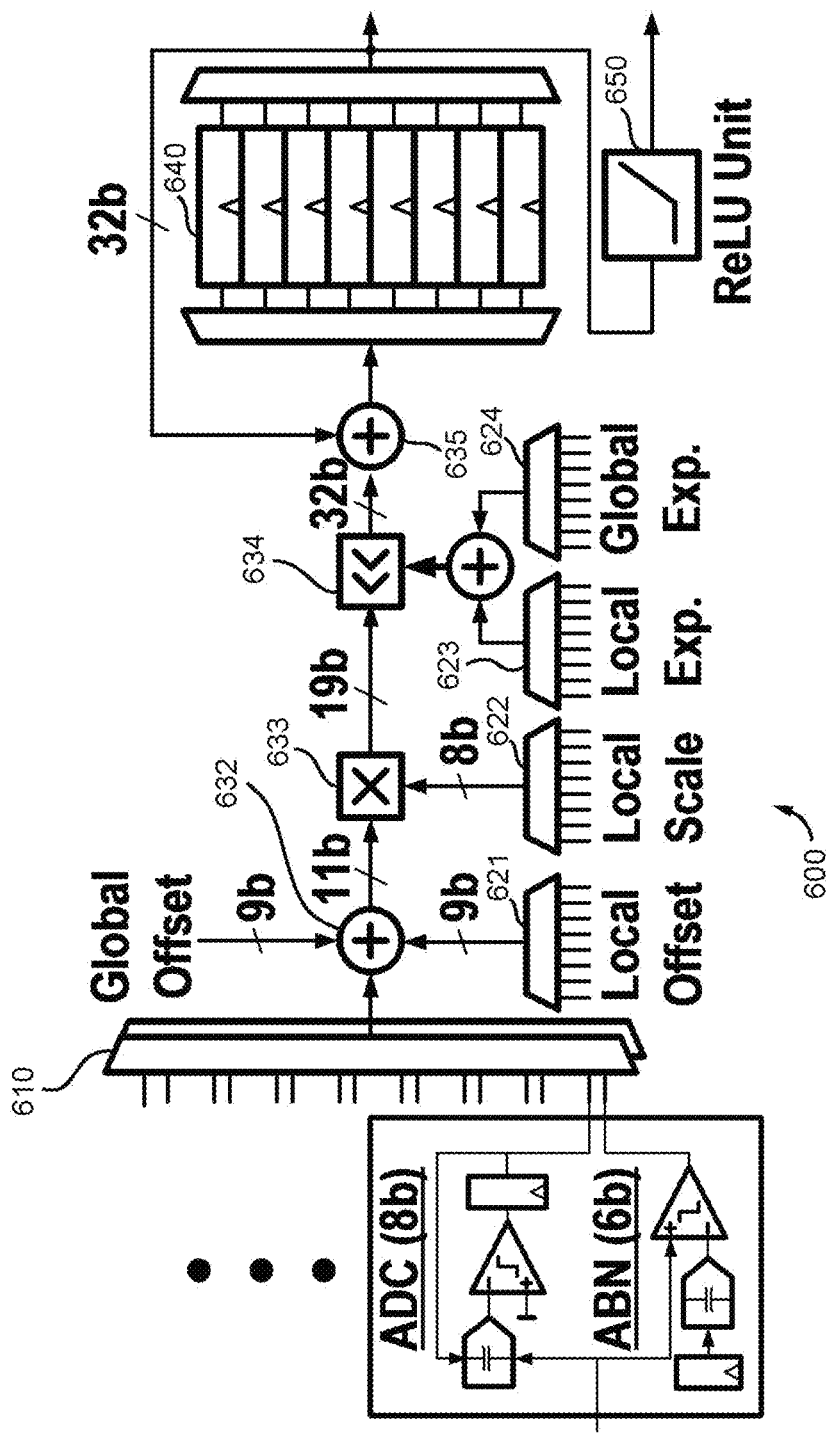
FIG. 6 depicts a high level block diagram of a Near-Memory Datapath (NMD) Module according to an embodiment and suitable for use in the architecture of FIG. 2.

FIG. 6 depicts a high level block diagram of a Near-Memory Datapath (NMD) Module 600 according to an embodiment and suitable for use in the architecture of FIG. 2, though digital near-memory computing with other features can be employed. The depicted NMD module 600 depicted in FIG. 6 shows a digital computation data path after ADC output which support multi-bit matrix multiplication via the BPB S scheme.

In the particular embodiment, 256 ADC outputs are organized into groups of 8 for the digital computation flow. This enables support of up to 8-bit matrix-element configuration. The NMD module 600 thus contains 32 identical NMD units. Each NMD unit consists of multiplexers 610/620 to select from 8 ADC outputs 610 and corresponding bias 621, multiplicands 622/623, shift numbers 624 and accumulation registers, an adder 631 with 8-bit unsigned input and 9-bit signed input to subtract the global bias and mask count, a signed adder 632 to compute local bias for neural network tasks, a fixed-point multiplier 633 to perform scaling, a barrel shifter 634 to compute the exponent of the multiplicand and perform shift for different bits in weight elements, a 32-bit signed adder 635 to perform accumulation, eight 32-bit accumulation registers 640 to support weight with 1, 2, 4 and 8-bit configurations, and a ReLU unit 650 for neural network applications.

Figure 7:
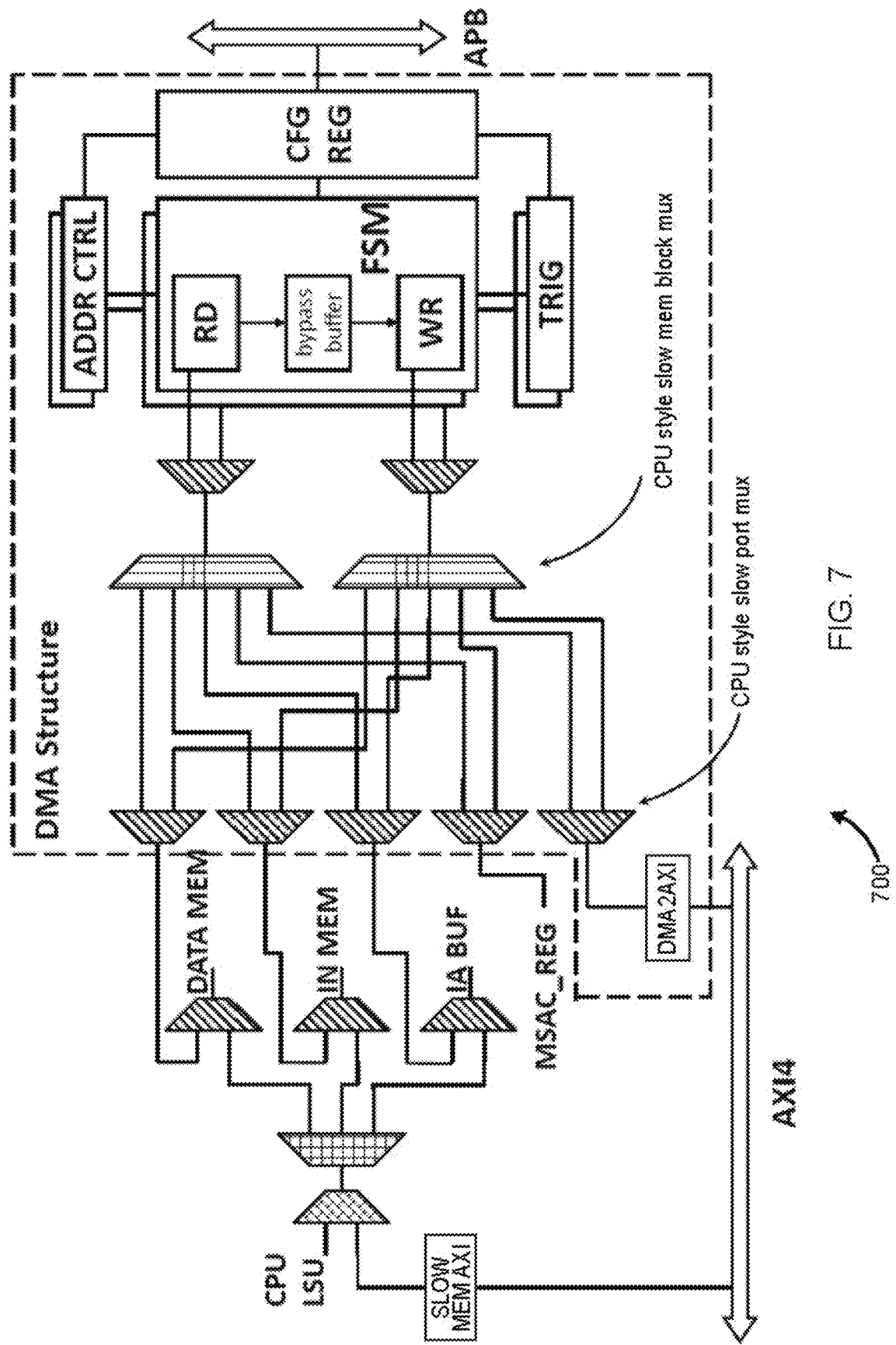
FIG. 7 depicts a high level block diagram of a direct memory access (DMA) module according to an embodiment and suitable for use in the architecture of FIG. 2.

FIG. 7 depicts a high level block diagram of a direct memory access (DMA) module 700 according to an embodiment and suitable for use in the architecture of FIG. 2. The depicted DMA module 700 is comprises, illustratively, two channels to support data transferring from/to different hardware resources simultaneously, and 5 independent data paths from/to DMEM, IA BUFF, CIMU R/W BUFF, NMD result and AXI4 bus, respectively.

Bit-Parallel/Bit-Serial (BPBS) Matrix-Vector Multiplication

Figure 8:
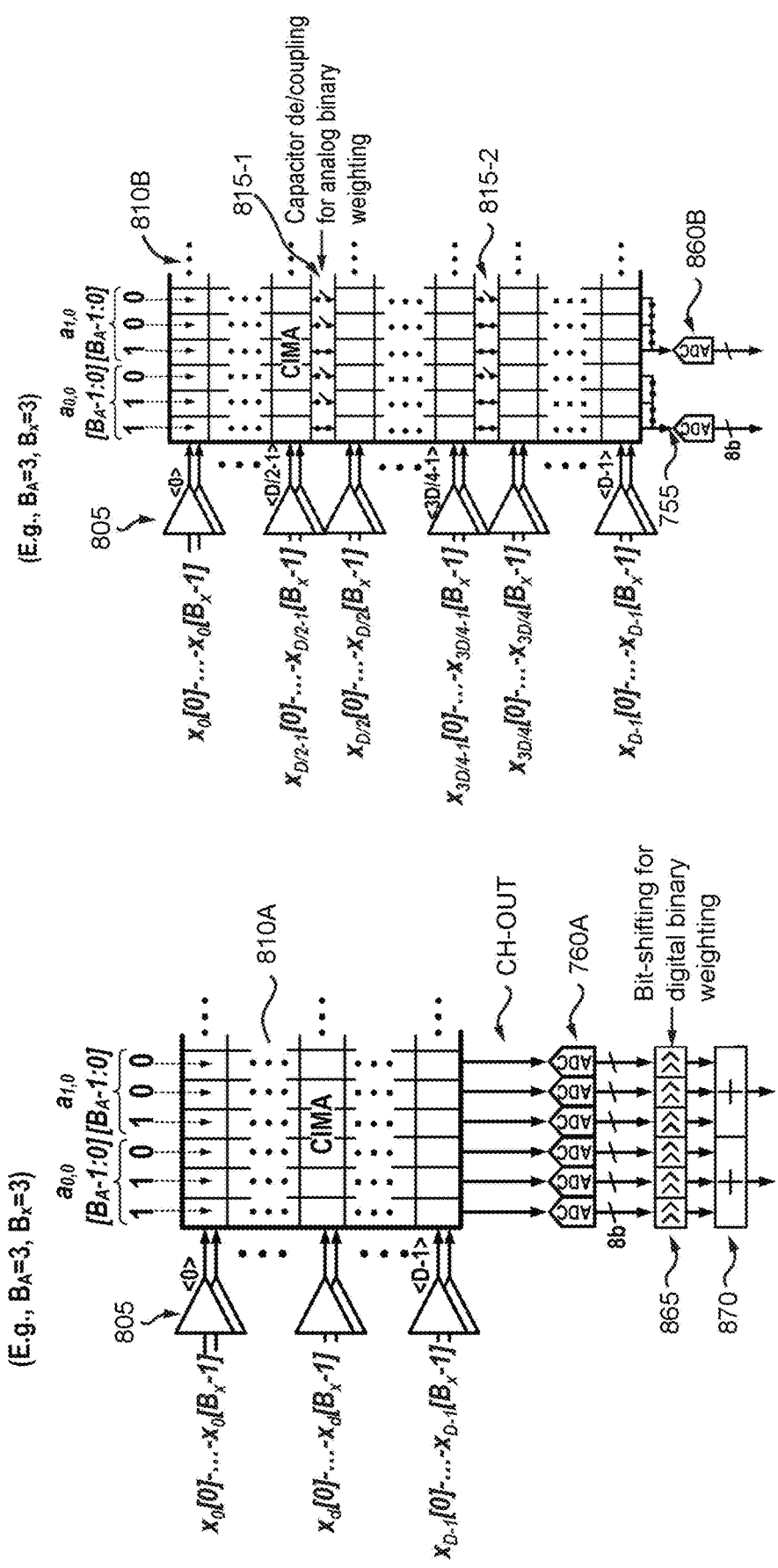
FIGS. 8A-8B depict high level block diagrams of differing embodiments of CIMA channel digitization/weighting suitable for use in the architecture of FIG. 2.

The BPBS scheme for multi-bit MVM $\vec{y}=A\vec{x}$ is shown in FIG. 8, where BA corresponds to the number of bits used for the matrix elements $a_{m,n}$, Bx corresponds to the number of bits used for the input-vector elements $x_n$, and N corresponds to the dimensionality of the input vector, which can be up to 2304 in the hardware of the embodiment ($M_n$ is a mask bit, used for sparsity and dimensionality control). The multiple bits of $a_{m,n}$ are mapped to parallel CIMA columns and the multiple bits of $x_n$ are inputted serially. Multi-bit multiplication and accumulation can then be achieved via in-memory computing either by bit-wise XNOR or by bit-wise AND, both of which are supported by the multiplying bit cell (M-BC) of the embodiment. Specifically, bit-wise AND differs from bit-wise XNOR in that the output should remain low when the input-vector-element bit is low. The M-BC of the embodiment involves inputting the input-vector-element bits (one at a time) as a differential signal. The M-BC implements XNOR, where each logic '1' output in the truth table is achieved by driving to VDD via the true and complement signals, respectively, of the input-vector-element bit. Thus, AND is easily achieved, simply by masking the complement signal, so that the output remains low to yield the truth-table corresponding to AND.

Bit-wise AND can support a standard 2's complement number representation for multi-bit matrix and input-vector elements. This involves properly applying a negative sign to the column computations corresponding to most-significant-bit (MSB) elements, in the digital domain after the ADC, before adding the digitized outputs to those of the other column computations.

Bit-wise XNOR requires slight modification of the number representation. I.e., element bits map to +1/−1 rather than 1/0, necessitating two bits with equivalent LSB weighting to properly represent zero. This is done as follows. First, each B-bit operand (in standard 2's complement representation) is decomposed to a B+1-bit signed integer. For example, y decomposes into B+1 plus/minus-one bits— $[y^{B-1}, y^{B-2} \ldots, y^1, (y_1^0, y_2^0)]$, to yield $y=\Sigma_{i=1}^{B-1} 2^i \cdot y^i (y_1^0 + y_2^0)$.

With 1/0-valued bits mapping to mathematical values of +1/−1, bit-wise in-memory-computing multiplication may be realized via a logical XNOR operation. The M-BC, performing logical XNOR using a differential signal for the input-vector element, can thus enable signed multi-bit multiplication by bit-weighting and adding the digitized outputs from column computations.

While the AND-based M-BC multiplication and XNOR-based M-BC multiplication present two options, other options are also possible, by using appropriate number representations with the logical operations possible in the M-BC. Such alternatives are beneficial. For example XNOR-based M-BC multiplication is preferred for binarized (1-b) computations while AND-based M-BC multiplication enables a more standard number representation to facilitate integration within digital architectures. Further, the two approaches yield slightly different signal-to-quantization noise ratio (SQNR), which can thus be selected based on application needs.

Heterogeneous Computing Architecture and Interface

The various embodiments described herein contemplate different aspects of charge-domain in-memory computing where a bit-cell (or multiplying bit cell, M-BC) drives an output voltage corresponding to a computational result onto a local capacitor. The capacitors from an in-memory-computing channel (column) are then coupled to yield accumulation via charge redistribution. As noted above, such capacitors may be formed using a particular geometry that is very easy to replicate such as in a VLSI process, such as via wires that are simply close to each other and thus coupled via an electric field. Thus, a local bit-cell formed as a capacitor stores a charge representing a one or a zero, while adding up all of the charges of a number of these capacitors or bit-cells locally enables the implementation of the functions of multiplication and accumulation/summation, which is the core operation in matrix vector multiplication.

The various embodiments describe above advantageously provide improved bit-cell based architectures, computing engines and platforms. Matrix vector multiplication is one operation not performed efficiently by standard, digital processing or digital acceleration. Therefore, doing this one type of computation in memory gives a huge advantage over existing digital designs. However, various other types of operations are performed efficiently using digital designs.

Various embodiments contemplate mechanisms for connecting/interfacing these bit-cell based architectures, computing engines, platforms and the like to more conventional digital computing architectures and platforms such as to form a heterogenous computing architecture. In this manner, those compute operations well suited to bit-cell architecture processing (e.g., matrix vector processing) are processed as described above, while those other computing operations well suited to traditional computer processing are processed via traditional computer architecture. That is, various embodiments provide a computing architecture including a highly parallel processing mechanism as described herein, wherein this mechanism is connected to a plurality of interfaces so that it can be externally coupled to a more conventional digital computing architecture. In this way the digital computing architecture can be directly and efficiently aligned to the in-memory-computing architecture, allowing the two to be placed in close proximity to minimize data-movement overheads between them. For example, while a machine learning application may comprise 80% to 90% matrix vector computations, that still leaves 10% to 20% of other types of computations/operations to be performed. By combining the in memory computing discussed herein with near memory computing that is more conventional in architecture, the resulting system provides exceptional configurability to perform many types of processing. Therefore, various embodiments contemplate near-memory digital computations in conjunction with the in-memory computing described herein.

The in-memory computations discussed herein are massively parallel but single bit operations. For example, in a bit-cell only one bit may be stored. A one or a zero. The signal that is driven to the bit-cell is typically an input vector (i.e., each matrix element is multiplied by each vector element in a 2D vector multiplication operation). The vector element is put on a signal that is also digital and is only one bit such that the vector element is one bit as well.

Various embodiments extend matrices/vectors from one-bit elements to multiple bit elements using a bit-parallel/bit-serial approach.

FIGS. 8A-8B depict high level block diagrams of differing embodiments of CIMA channel digitization/weighting suitable for use in the architecture of FIG. 2. Specifically, FIG. 8A depicts a digital binary weighting and summation embodiment similar to that described above with respect to the various other figures. FIG. 8B depicts an analog binary weighting and summation embodiment with modifications made to various circuit elements to enable the use of fewer analog to digital converters than the embodiments of FIG. 8A and/or other embodiments described herein.

As previously discussed, various embodiments contemplate that a compute-in-memory (CIM) array of bit-cells is configured to receive massively parallel bit-wise input signals via a first CIM array dimension (e.g., rows of a 2D CIM array) and to receive one or more accumulation signals via a second CIM array dimension (e.g., columns of a 2D CIM array), wherein each of a plurality of bit-cells associated with a common accumulation signal (depicted as, e.g., a column of bit-cells) forms a respective CIM channel configured to provide a respective output signal. Analog-to-digital converter (ADC) circuitry is configured to process the plurality of CIM channel output signals to provide thereby a sequence of multi-bit output words. Control circuitry is configured to cause the CIM array to perform a multi-bit computing operation on the input and accumulation signals using single-bit internal circuits and signals such that a near-memory computing path operably engage thereby may be configured to provide the sequence of multi-bit output words as a computing result.

Referring to FIG. 8A, a digital binary weighting and summation embodiment performing the ADC circuitry function is depicted. In particular, a two dimensional CIMA 810A receives matrix input values at a first (rows) dimension (i.e., via a plurality of buffers 805) and vector input values at a second (columns) dimension, wherein the CIMA 810A operates in accordance with control circuitry and the like (not shown) to provide various channel output signals CH-OUT.

The ADC circuitry of FIG. 8A provides, for each CIM channel, a respective ADC 760 configured to digitize the CIM channel output signal CH-OUT and a respective shift register 865 configured to impart a respective binary weighting to the digitized CIM channel output signal CH-OUT to form thereby a respective portion of a multi-bit output word 870.

Referring to FIG. 8B, an analog binary weighting and summation embodiment performing the ADC circuitry function is depicted. In particular, a two dimensional CIMA 810B receives matrix input values at a first (rows) dimension (i.e., via a plurality of buffers 805) and vector input values at a second (columns) dimension, wherein the CIMA 810B operates in accordance with control circuitry and the like (not shown) to provide various channel output signals CH-OUT.

The ADC circuitry of FIG. 8B provides four controllable (or preset) banks of switches 815-1, 815-2 and so on within the CIMA 810B operate to couple and/or decouple capacitors formed therein to implement thereby an analog binary weighting scheme for each of one or more subgroups of channels, wherein each of the channel subgroups provides a single output signal such that only one ADC 860B is required to digitize a weighted analog summation of the CIM channel output signals of the respective subset of CIM channels to form thereby a respective portion of a multi-bit output word.

Figure 9:
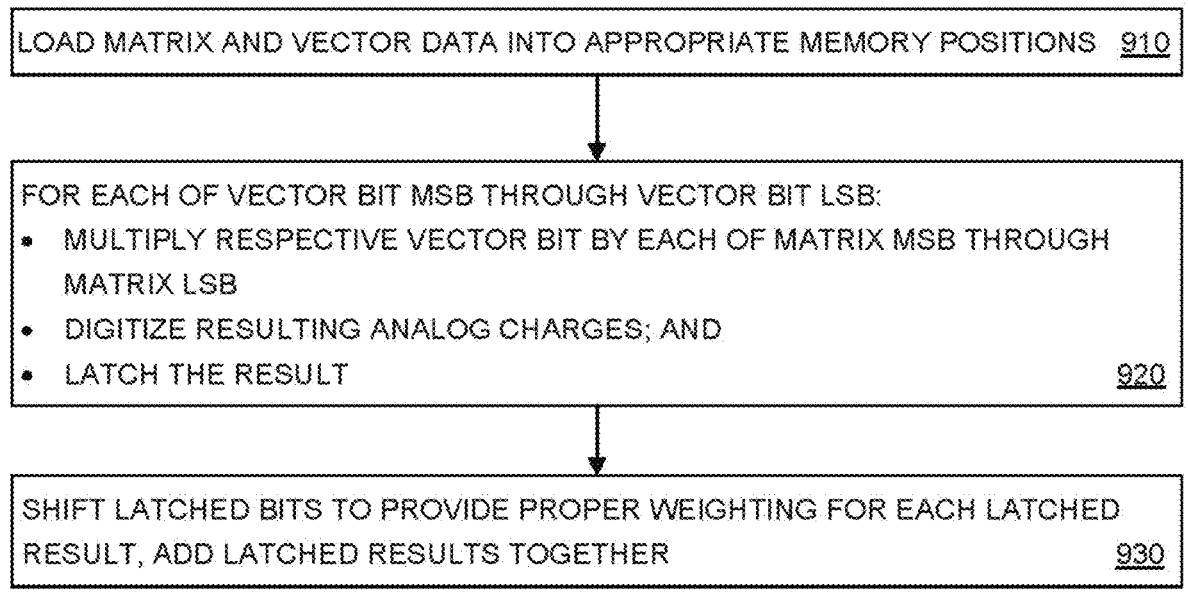
FIG. 9 depicts a flow diagram of a method according to an embodiment.

FIG. 9 depicts a flow diagram of a method according to an embodiment. Specifically, the method 900 of FIG. 9 is directed to the various processing operations implemented by the architectures, systems and so on as described herein wherein an input matrix/vector is extended to be computed in a bit parallel/bit serial approach.

At step 910, the matrix and vector data are loaded into appropriate memory locations.

At step 920, each of the vector bits (MSB through LSB) is sequentially processed. Specifically, the MSB of the vector is multiplied by the MSB of the matrix, the MSB of the vector is multiplied by the MSB-1 of the matrix, the MSB of the vector multiplied by the MSB-2 of the matrix and so on through to the MSB of the vector multiplied by the LSB of the matrix. The resulting analog charge results are then digitized for each of the MSB through LSB vector multiplications to get a result, which is latched. This process is repeated for the vector MSB-1, vector MSB-2 and so on through the vector LSB until such time as the each of the vector MSB-LSB has been multiplied by each of the MSB-LSB elements of the matrix.

At step 930, the bits are shifted to apply a proper weighting and the results added together. It is noted that in some of the embodiments where analog weighting is used, the shifting operation of step 930 is unnecessary.

Various embodiments enable highly stable and robust computations to be performed within a circuit used to store data in dense memories. Further, various embodiments advance the computing engine and platform described herein by enabling higher density for the memory bit-cell circuit. The density can be increased both due to a more compact layout and because of enhanced compatibility of that layout with highly-aggressive design rules used for memory circuits (i.e., push rules). The various embodiments substantially enhance the performance of processors for machine learning, and other linear algebra.

Disclosed is a bit-cell circuit which can be used within an in-memory computing architecture. The disclosed approach enables highly stable/robust computation to be performed within a circuit used to store data in dense memories. The disclosed approach for robust in memory computing enables higher density for the memory bit-cell circuit than known approaches. The density can be higher both due to a more compact layout and because of enhanced compatibility of that layout with highly-aggressive design rules used for memory circuits (i.e., push rules). The disclosed device can be fabricated using standard CMOS integrated circuit processing.

Memory accessing dominates energy and delay in many compute workloads. Memory energy and delay arises because in standard memories, raw data is accessed row by row, incurring a communication cost of moving data from the point of storage to the point of compute, outside the memory array. On the other hand, in-memory-computing architectures access a computational result over many bits of data stored across the rows, thus accessing many rows at once and amortizing the communication costs.

While such amortization reduces energy and delay by multiplier factors (i.e., roughly the number of rows simultaneously accessed), the primary challenge is that computational signal-to-noise ratio (SNR) is also reduced by a corresponding factor. This is because, computation over a large number of bits typically increases the required dynamic range; but, fitting this within the limited swing of the existing bit-lines in a memory squeezes the SNR. Specifically, the computational noise of in-memory architectures is dominated by the variations and non-linearities of compute operations performed by the bit-cells. In standard memories, bit-cells provide an output current. This has made current-domain computation a natural choice for in-memory computing architectures, with the aim of minimizing changes to the high-density bit-cells standardly used.

However, bit-cell current is subject to the high-levels of variations and nonlinearities affecting bit-cell transistors. This limits the SNR, and thus scalability, of in-memory computing. Improvements are obtained in accordance with various embodiments using charge-domain computation. Here, the computational output from a bit-cell is stored as charge on a capacitor. For example, various embodiments contemplate the use of metal-finger capacitors laid out above the bit-cell transistors; such capacitors incur no additional area, thereby enabling bit-cells to maintain dense structure. Importantly for computational SNR, such capacitors also exhibit very good linearity, as well as high stability in the presence of process and temperature variations. This has substantially increased the scalability of in-memory computing.

While the metal finger capacitor can be laid out above the bit-cell, some circuit changes within the bit-cell are necessary, for switched-capacitor charge-domain computation. The current invention focuses on circuits and layouts to enable high density of charge-domain bit-cell computation in static random-access memory (SRAM). In particular, circuits and layouts that enhance compatibility with the aggressive push design rules used for SRAM bit-cells are described.

Figure 10:
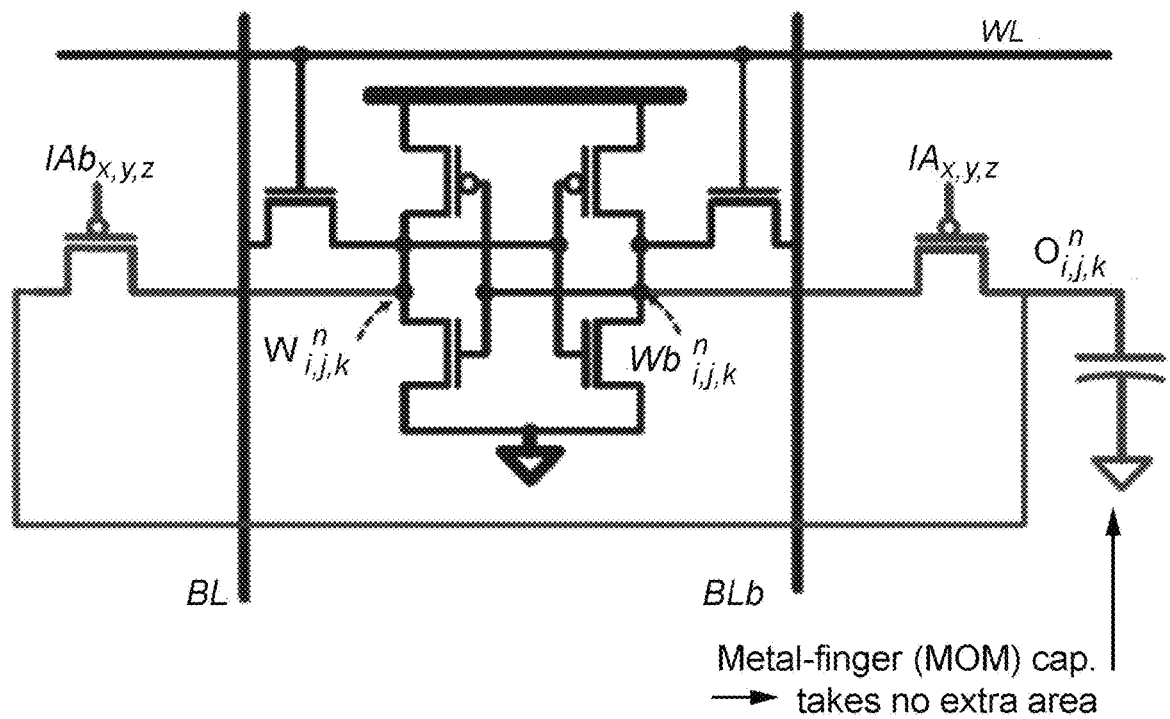
FIG. 10 depicts a circuit diagram of a multiplying bit-cell.

FIG. 10 depicts a circuit diagram of a multiplying bit-cell. The bit-cell of FIG. 10 performs operations such as storage, writing, and reading of 1-b data, and also enables multiplication between the 1-b data stored and the 1-b IA/IAb signal (differential). The structure is thus referred to as a multiplying bit-cell (M-BC). It is noted that a 1-b multiplication corresponds to a logical XNOR operation. To implement this, PMOS transistors are added, coupled to the bit-cell storage nodes and driven by the IA/IAb signal, as depicted in FIG. 10.

Figure 11:
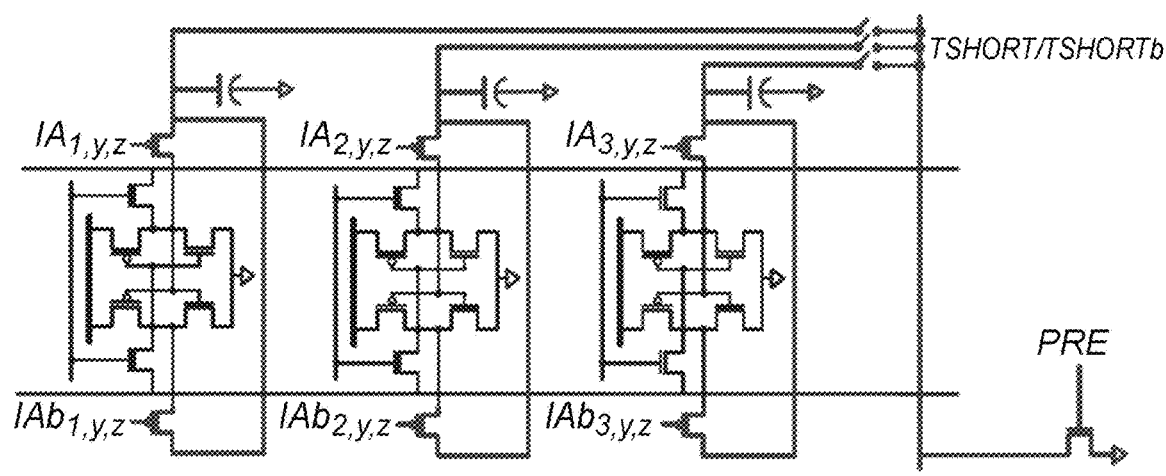
FIG. 11 depicts a circuit diagram of three M-BCs configured to perform an XNOR function.

FIG. 11 depicts a circuit diagram of three M-BCs configured to perform an XNOR function. Specifically, the operation of the circuit of FIG. 11 comprises, for three M-BCs: (1) the M-BC capacitors are unconditionally discharged, by asserting a capacitor shorting switch (TSHORT/TSHORTb) and a discharge NMOS transistor (PRE); (2) TSHORT/TSHORTb are de-asserted and IA/IAb are driven, storing the M-BC XNOR output on the local M-BC capacitor; (3) IA/IAb are de-asserted and TSHORT is asserted, accumulating the charge from all XNOR results, to give a multiplication-accumulation computation. It is noted that, in addition to the 8 M-BC transistors, two additional NMOS/PMOS transistors are required per M-BC for TSHORT/TSHORTb implementation. In the previous design, these NMOS/PMOS transistors were laid out outside each M-BC, together for three M-BCs, since this enables efficient sharing of nodes.

It is noted that PMOS transistors for bit-cell compute lead to balanced use of NMOS and PMOS transistors within an M-BC, thus resulting in a IC layout that is very different from that of a standard 6-transistor (6T) SRAM bit-cell. This impacts the potential for push-rule compatibility.

Various embodiments contemplate new M-BC circuits that add NMOS transistors for the bit-cell compute. In this manner, the embodiments provide IC layouts that are both denser and closer to the standard 6T bit-cell, and that also enhance push rule compatibility.

Figure 12:
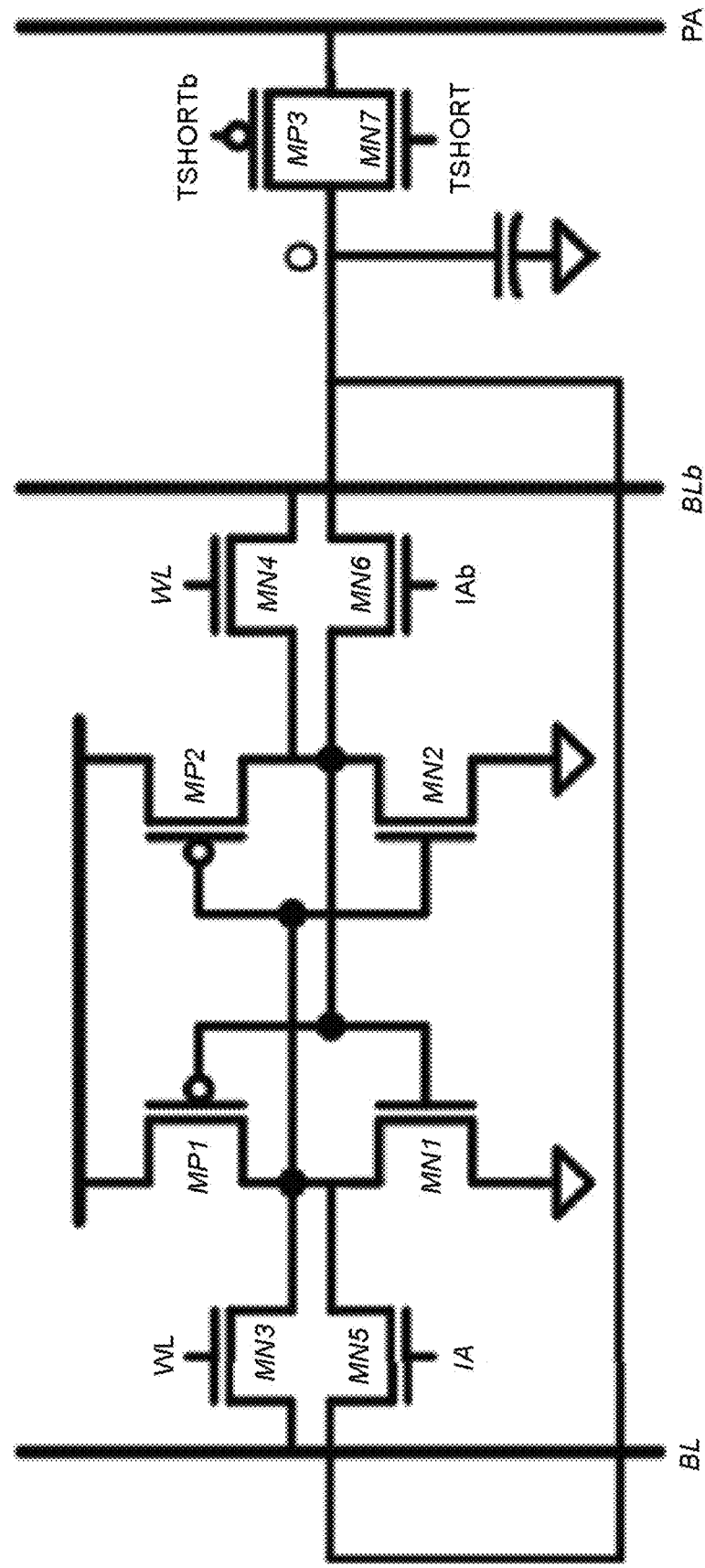
FIG. 12 depicts a circuit diagram of an M-BC according to an embodiment.

FIG. 12 depicts a circuit diagram of an M-BC according to an embodiment. Specifically, the M-BC of FIG. 12 implements 1-b charge-domain multiplication (XNOR) using NMOS transistors. Here, the NMOS inputs IA/IAb are low during unconditional discharge of the local capacitor, and then driven differentially for compute.

FIG. 13 depicts an exemplary layout of the M-BC of FIG. 12. Specifically, the layout of FIG. 13 contemplates including the NMOS/PMOS TSHORT switches compactly within a single M-BC (metal finger capacitor is laid out above the bit-cell). In the layout of FIG. 13, the signals WL, IA/IAb run horizontally while the signals BL, Blab, PA, VDD, GND run vertically. This layout has roughly 2× the area of a standard 6T cell and exploits an opportunity to share several nodes with surrounding M-BCs.

While the disclosed approach takes more area than standard memory bit-cell circuits, a large fraction of the bit-cell has been demonstrated with push rules, and the extensions to this are similar to other structures for which push rules have been successfully used. The disclosed approach substantially enhance the performance of processors for machine learning, and other linear algebra. Such gains have been demonstrated experimentally for an earlier architecture, and the disclosed approach substantially advances that architecture.

As previously noted, compute operations within memory bit-cells provide their results as charge, typically using voltage-to-charge conversion via a capacitor. Thus, bit-cell circuits involve appropriate switching of a local capacitor in a given bit-cell, where that local capacitor is also appropriately coupled to other bit-cell capacitors, to yield an aggregated compute result across the coupled bit-cells.

Disclosed herein are charge-inject robust bit-cells and bit-cell layouts for reconfigurable charge-domain in-memory computing. The disclosed device, specifically a bit-cell circuit, can be used within an in-memory computing architecture. The disclosed approach enables highly stable/robust computation as well as reconfigurable computation to be performed within a circuit used to store data in dense memories. The disclosed approach enables greater robustness and reconfigurability for in-memory computing than prior approaches. The disclosed device may be fabricated using standard CMOS integrated circuit processing. The disclosed approach will have significant utility to the semiconductor industry as it can substantially enhance the performance of processors for machine learning, and other linear algebra.

The approach disclosed herein pertains to two new aspects of bit-cell circuits: (1) a configuration where the coupling across bit-cell capacitors can be achieved without the need for an explicit switch (switch-free coupled structure); and (2) a physical layout where coupled bit-cells are interleaved with other coupled bit-cells (interleaved layout).

The switch-free coupled structure pertains to a bit-cell that provides its compute result on one of the capacitor plates, and where coupling across capacitors is achieved via the other capacitor plate. This is in contrast to switch-based coupled structures where bit-cell circuits provide compute results on the same capacitor plate that is eventually coupled to the other capacitors, typically via a switch.

FIG. 14A depicts a block diagram of a bit-cell with a switch-based coupled structure, while FIG. 14B depicts a block diagram of a bit-cell with a switch-free coupled structure. In both cases, the coupled capacitors first need to be reset (removing the charge on them) such as by shorting the output node at which the capacitors are coupled. Then, a compute operation f(.) is performed locally in the bit-cell. This is illustrated for two operands a & b, where one operand is stored in the bit-cell and one is provided externally from the bit-cell array periphery; however, in general structures with more operands are possible. The compute operation then drives the plate of a local capacitor, which is coupled to other capacitors, either through a switch on the sample plate (switch-based coupled structure), or without a switch on the other plate (switch-free coupled structure). Advantageously, the switch-free coupled structure of FIG. 14B avoids a the need for a coupling switch in the bit-cell and, further, has the potential to reduce the effects of charge-injection errors such as where the switch, when implemented by MOSFETs, can cause variable amounts of charge to be absorbed/released by the MOSFETs (dependent on voltage level) to thereby slightly corrupt a charge-domain compute.

Figure 15:
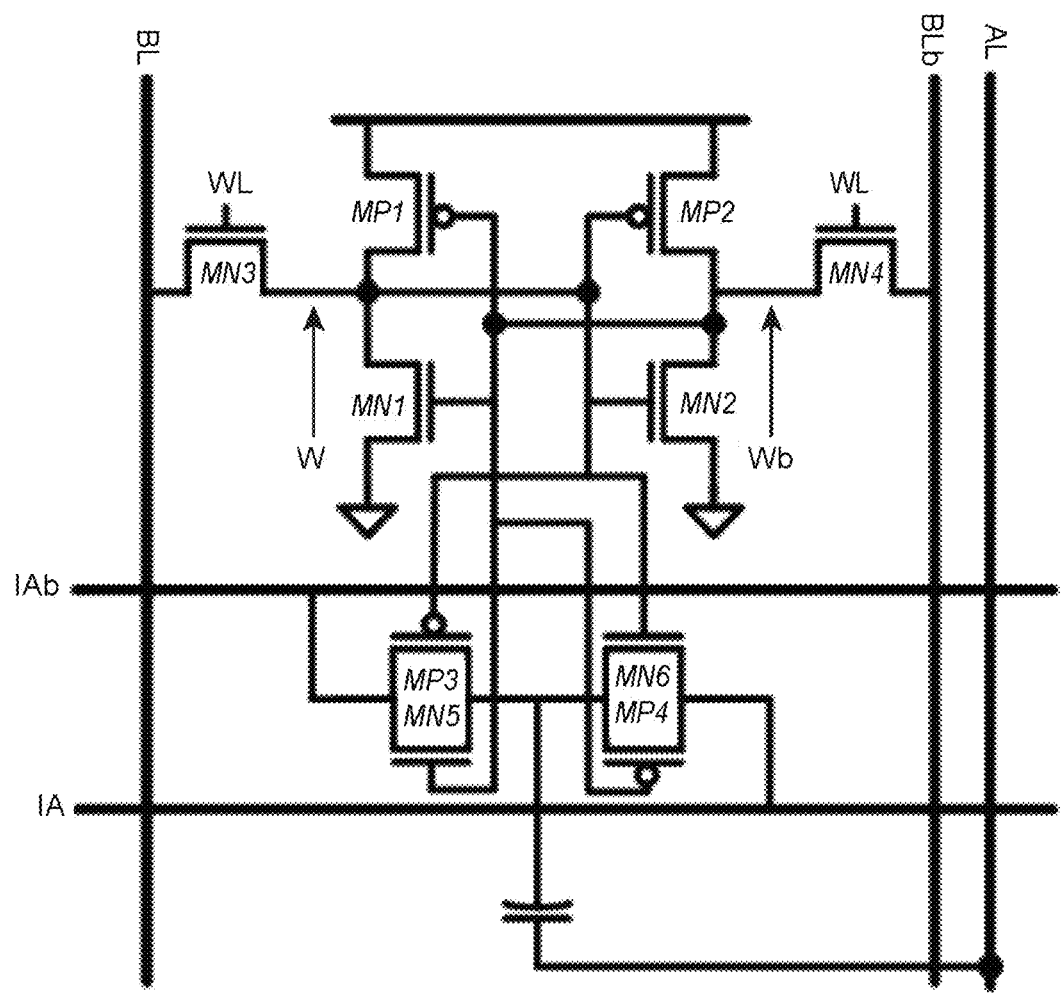
FIG. 15 depicts a circuit diagram of a bit-cell circuit having a switch-free coupled structure according to an embodiment.

FIG. 15 depicts a circuit diagram of a bit-cell circuit having a switch-free coupled structure according to an embodiment. It is noted that other variations of this circuit are also possible within the context of the disclosed embodiments. The bit-cell of FIG. 15 enables implementation of either XNOR or AND operation between data stored W/Wb (within the 6-transistor cross-coupled circuit formed by MN1-3/MP1-2) and data inputted IA/IAb. For example, for a XNOR operation, after resetting, IA/IAb can be driven in a complementary manner, resulting in the bottom plate of the local capacitor being pulled up/down according to IA XNOR W. On the other hand, for an AND operation, after resetting, only IA may be driven (and IAb kept low), resulting in the bottom plate of the local capacitor being pulled up/down according to IA AND W. Advantageously, this structure enables a reduction in total switching energy of the capacitors due to a series pull-up/pull-down charging structure resulting between all of the coupled capacitors, as well as a reduction in the effects of switch charge injection errors due to the elimination of a coupling switch at the output node.

Figure 16:
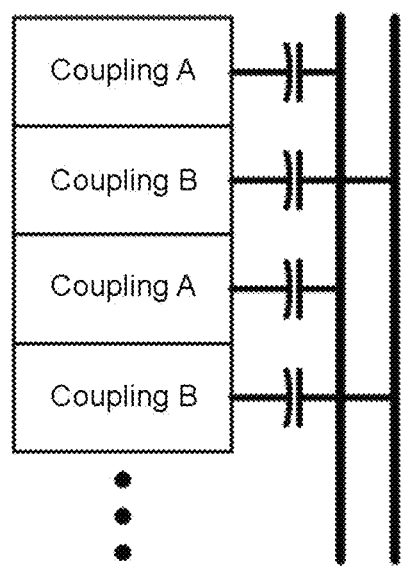
FIG. 16 depicts a circuit diagram of a 2-way interleaving of bit-cell layouts according to an embodiment.

FIG. 16 depicts a circuit diagram of a 2-way interleaving of bit-cell layouts according to an embodiment. Specifically, the interleaved layout of bit-cells pertains to a layout where the capacitors may be coupled together in two or more sets. While FIG. 16 shows an illustration of this for the case of 2-way interleaving, higher interleaving is also contemplated in various embodiments. Further, while capacitors are shown laid out on the side of the column, it is noted that in practice they may also be laid out above the bit-cell transistors and/or in other locations proximate the bit-cell transistors. The benefit of this structure is, among other things, enhanced configurability. Namely, Coupling A and B can be used to implement separate computations, since outputs are provided on two different nodes. Or, Coupling A and B can be used to implement a joint computation by appropriately combining the outputs on different nodes, for instance through appropriate peripheral circuitry.

It will be appreciated that the functions depicted and described herein may be implemented in hardware or in a combination of software and hardware, e.g., using a general purpose computer, one or more application specific integrated circuits (ASIC), or any other hardware equivalents. It is contemplated that some of the steps discussed herein may be implemented within hardware, for example, as circuitry that cooperates with the processor to perform various method steps. Portions of the functions/elements described herein may be implemented as a computer program product wherein computer instructions, when processed by a computing device, adapt the operation of the computing device such that the methods or techniques described herein are invoked or otherwise provided. Instructions for invoking the inventive methods may be stored in tangible and non-transitory computer readable medium such as fixed or removable media or memory, or stored within a memory within a computing device operating according to the instructions.

Various modifications may be made to the systems, methods, apparatus, mechanisms, techniques and portions thereof described herein with respect to the various figures, such modifications being contemplated as being within the scope of the invention. For example, while a specific order of steps or arrangement of functional elements is presented in the various embodiments described herein, various other orders/arrangements of steps or functional elements may be utilized within the context of the various embodiments. Further, while modifications to embodiments may be discussed individually, various embodiments may use multiple modifications contemporaneously or in sequence, compound modifications and the like.

While specific systems, apparatus, methodologies, mechanisms and the like have been disclosed as discussed above, it should be apparent to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. In addition, the references listed herein are also part of the application and are incorporated by reference in their entirety as if fully set forth herein.

Aspects of various embodiments are specified in the claims and/or the following numbered clauses:

1. A bit-cell circuit configuration comprising: a bit-cell storage circuit coupled to at least one bit-cell compute device; and a bit-cell capacitor coupled to the bit-cell compute device, the bit-cell capacitor being further coupled to one or more additional capacitors without a switch between the bit-cell capacitor and additional capacitors.

2. The bit-cell circuit configuration of clause 1, wherein a cathode plate of the bit-cell capacitor is coupled to the bit-cell compute device.

3. The bit-cell circuit configuration of clause 1, wherein an anode plate of the bit-cell capacitor is coupled to the additional capacitors.

4. The bit-cell circuit configuration of clause 1, wherein the bit-cell compute device is configured to perform a compute operation with two operands.

5. A bit-cell circuit configuration as illustrated by FIG. 11.

6. The bit-cell circuit configuration of clause 5, wherein the configuration enables implementation of XNOR or AND operations between data stored and data inputted.

7. An interleaved layout for at least two bit-cell configurations of clause 1, wherein the bit-cell capacitors are coupled together in at least two sets.

8. The interleaved layout of clause 7, wherein the sets of coupled bit-cell capacitors are laid out above one or more bit-cell transistors.

9. A charge-domain in-memory-computing bit cell that drives one plate of a local capacitor, and where coupling to other bit-cell capacitors is achieved at the other plate.

10. A charge-domain in-memory-computing bit cell that can implement XNOR or AND operations between stored data and inputted data.

11. An interleaved layout for charge-domain in-memory-computing bit cells, where bit-cell capacitors are coupled in multiple different sets.

12. An interleaved layout for charge-domain in-memory-computing bit cells, where bit-cell capacitors are coupled in multiple different sets so that there are X sets for X-way interleaving, X being an integer greater than one.

13. A layout for charge-domain in-memory-computing bit cells, where the different sets of coupled capacitors are laid out above the bit-cell transistors.

14. A multiplying bit cell (M-BC) configured to perform charge-domain computation between stored data in a bit-cell and a 1-b input signal.

15. The M-BC of clause 14, wherein one or more NMOS transistors are utilized to perform the charge-domain computation.

16. The M-BC of clause 14, further comprising a capacitor being a metal structure positioned above the bit-cell.

17. The M-BC of clause 14, wherein the M-BC is configured to implement logic operations.

18. The M-BC of clause 17, wherein the logic operations include XNOR, NAND, AND, and other logic operations.

19. The M-BC of clause 14, further comprising a layout as illustrated in FIG. 12.

20. The M-BC of clause 14, further comprising an extended layout of a 6T cell.

21. The M-BC of clause 20, further comprising transistors having regular poly structure.

22. The M-BC of clause 14, further comprising a layout as illustrated in FIG. 13.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof.

What is claimed is:

1. An in-memory computing architecture, comprising:
a compute-in-memory (CIM) array of bit-cells configured to receive parallel bit-wise input signals via a first CIM array dimension and to drive one or more accumulation signals via a second CIM array dimension, wherein each plurality of bit-cells associated with a common analog accumulation signal forms a respective CIM channel configured to provide analog representation of a respective portion of a multi bit computation output signal; and
control circuitry configured to cause the CIM array to perform a multi-bit computing operation on the input and accumulation signals using single-bit internal circuits and signals;
wherein each bit-cell in said CIM array of bit-cells has a bit-cell circuit configuration comprising:
a bit-cell storage circuit coupled to at least one bit-cell compute device; and
a bit-cell capacitor coupled to the bit-cell compute device, the bit-cell capacitor being further coupled to one or more additional capacitors corresponding to other bit-cell capacitors without a switch between the bit-cell capacitors.

2. The in-memory computing architecture of claim 1, further comprising a reshaping buffer, configured to reshape a sequence of received data words to form the parallel bit-wise input signals.

3. The in-memory computing architecture of claim 1, further comprising analog-to-digital converter (ADC) circuitry configured to process the plurality of CIM channel output signals to provide thereby a sequence of multi-bit output words.

4. The in-memory computing architecture of claim 3, further comprising a near-memory computing path configured to provide said sequence of multi-bit output words as a computing result.

5. The in-memory computing architecture of claim 3, wherein said ADC circuitry comprises, for each CIM channel, a respective ADC configured to digitize the CIM channel output signal, and a respective shift register configured to impart a respective binary weighting to the digitized CIM channel output signal to form thereby a respective portion of a multi-bit output word.

6. The in-memory computing architecture of claim 3, wherein said ADC circuitry comprises, for each of a plurality of subsets of said CIM channels, a respective ADC configured to digitize a weighted analog summation of the CIM channel output signals of the respective subset of CIM channels to form thereby a respective portion of a multi-bit output word.

7. The in-memory computing architecture of claim 1, further comprising a sparsity controller configured to mask zero-valued elements of the parallel bit-wise input signals such that said multi-bit computing operation avoids processing zero-valued elements of the parallel bit-wise input signals.

8. The in-memory computing architecture of claim 1, wherein the input signals and accumulation signals are combined with existing signals within the memory.

9. The in-memory computing architecture of claim 1, wherein the input signals and accumulation signals are separate from existing signals within the memory.

10. The in-memory computing architecture of claim 3, wherein each ADC and respective accumulation signal forms an in-memory computing channel.

11. The in-memory computing architecture of claim 4, wherein said near-memory computing path comprises one or more of digital barrel shifters, multiplexers, accumulators, look-up tables, and non-linear function elements.

12. The in-memory computing architecture of claim 10, wherein the multi-bit computing operation of the CIM array comprises bit-parallel/bit-serial (BPBS) computing,
wherein said bit-parallel computing comprises:
loading different matrix-element bits into respective in-memory computing channels;
using respective barrel shifters, barrel shifting digitized outputs from the computing channels to implement thereby corresponding bit weightings; and
using respective accumulators, performing digital accumulation over all of the computing channels to yield a multi-bit matrix-element compute result; and
wherein said bit-serial computing comprises:
individually applying each bit of a vector element to the loaded matrix-element bits and storing each resulting digitized output; and
using respective barrel shifters, barrel shifting the stored digitized outputs associated with each vector element bit prior to a digital accumulation with stored digitized outputs corresponding to subsequent input vector bits.

13. The in-memory computing architecture of claim 4, where the near-memory computing path is physically aligned with the in-memory-computing architecture to increase throughput therethrough.

14. The in-memory computing architecture of claim 1, further comprising one or more configurable finite-state machines (FSMs) configured to control computational operation of the in-memory computing architecture.

15. The in-memory computing architecture of claim 14, where the FSM controlling the computational operation is configured to control parallel computing hardware utilized by some or all of a plurality of in-memory computing channels.

16. The in-memory computing architecture of claim 14, wherein the FSMs control computations in accordance with software instructions loaded in a local memory.

17. The in-memory computing architecture of claim 2, wherein the reshaping buffer is configured to convert external digital words of a first precision into a high-dimensionality input vector.

18. The in-memory computing architecture of claim 17, wherein the reshaping buffer is configured to provide bits of the input vector elements in a sequenced and parallel manner to the CIM array.

19. The in-memory computing architecture of claim 2, wherein the reshaping buffer is configured for alignment input data to ensure a desired utilization and throughput of in-memory-computing operations.

20. The in-memory computing architecture of claim 2, wherein the reshaping buffer is configured to enable reuse and shifting of input data in accordance with convolutional-neural-network operations.

21. The in-memory computing architecture of claim 1, wherein the bit-cell circuit configuration further comprises a cathode plate of the bit-cell capacitor being coupled to the bit-cell compute device.

22. The in-memory computing architecture of claim 1, wherein the bit-cell circuit configuration further comprises an anode plate of the bit-cell capacitor being coupled to the additional capacitors.

23. The in-memory computing architecture of claim 1, wherein the bit-cell circuit configuration further comprises the bit-cell compute device being configured to perform a compute operation with two operands.

24. The in-memory computing architecture of claim 1, wherein the bit-cell circuit configuration enables implementation of XNOR or AND operations between data stored and data inputted.

25. The in-memory computing architecture of claim 1, wherein a bit-cell circuit configuration comprising an interleaved layout for at least two bit-cells in which respective bit-cell capacitors are coupled together in at least two separate sets to enable thereby corresponding separate computations.

26. The in-memory computing architecture of claim 25, wherein the sets of coupled bit-cell capacitors are laid out above one or more bit-cell transistors.

27. The in-memory computing architecture of claim 25, wherein the bit-cells comprise charge-domain in-memory-computing bit-cells that drive one plate of a respective local capacitor, and where coupling to other bit-cell capacitors is achieved at another plate of the respective local capacitor.

28. The in-memory computing architecture of claim 27 wherein the charge-domain in-memory-computing bit-cells are configured to implement XNOR or AND operations between stored data and inputted data.

29. The in-memory computing architecture of claim 25, wherein an interleaved layout for charge-domain in-memory-computing bit-cells is provided such that bit-cell capacitors are coupled in multiple different sets configured to be selectively coupled via one or more peripheral switches.

30. The in-memory computing architecture of claim 25, wherein an interleaved layout for charge-domain in-memory-computing bit-cells is provided such that bit-cell capacitors are coupled in multiple different sets so that there are X sets for X-way interleaving, wherein X in an integer greater than one.

31. The in-memory computing architecture of claim 26, wherein a layout for charge-domain in-memory-computing bit-cells is provided such that different sets of coupled capacitors are laid out above the bit-cell transistors.

\* \* \* \* \*